United States Patent
Honda et al.

(10) Patent No.: US 11,775,714 B2
(45) Date of Patent: Oct. 3, 2023

(54) RATIONAL DECISION-MAKING TOOL FOR SEMICONDUCTOR PROCESSES

(71) Applicant: PDF Solutions, Inc., Santa Clara, CA (US)

(72) Inventors: Tomonori Honda, Santa Clara, CA (US); Lin Lee Cheong, San Jose, CA (US); Lakshmikar Kuravi, Campbell, CA (US); Bogdan Cirlig, Saratoga, CA (US)

(73) Assignee: PDF Solutions, Inc., Santa Clara, CA (US)

( * ) Notice: Subject to any disclaimer, the term of this patent is extended or adjusted under 35 U.S.C. 154(b) by 0 days.

(21) Appl. No.: 17/303,666

(22) Filed: Jun. 4, 2021

(65) Prior Publication Data

US 2021/0294950 A1 Sep. 23, 2021
US 2022/0327268 A9 Oct. 13, 2022

Related U.S. Application Data

(63) Continuation-in-part of application No. 16/297,403, filed on Mar. 8, 2019, now Pat. No. 11,029,359.

(60) Provisional application No. 62/640,870, filed on Mar. 9, 2018, provisional application No. 62/641,170, filed on Mar. 9, 2018, provisional application No.
(Continued)

(51) Int. Cl.
*G06F 30/33* (2020.01)
*G06N 20/00* (2019.01)
*G06Q 30/0201* (2023.01)

(52) U.S. Cl.
CPC ............. *G06F 30/33* (2020.01); *G06N 20/00* (2019.01); *G06Q 30/0201* (2013.01)

(58) Field of Classification Search
CPC .. G06F 30/33; G06F 30/3308; G06F 33/3315; G06Q 30/0201; G06N 20/00; G06N 5/01; G01R 31/2822; H04B 17/0085; H04B 17/3913
See application file for complete search history.

(56) References Cited

U.S. PATENT DOCUMENTS 3,751,647 A 8/1973 Maeder et al.
5,793,650 A 8/1998 Mirza
(Continued)

FOREIGN PATENT DOCUMENTS

CN 101738991 B 9/2014

OTHER PUBLICATIONS

International Search Report and Written Opinion for PCT Application No. PCT/US2015//062693; dated Feb. 9, 2016.
(Continued)

*Primary Examiner* — Nguyen T Vo
(74) *Attorney, Agent, or Firm* — Dergosits & Noah LLP

(57) ABSTRACT

A robust predictive model. A plurality of different predictive models for a target feature are run, and a comparative analysis provided for each predictive model that meet minimum performance criteria for the target feature. One of the predictive models is selected, either manually or automatically, based on predefined criteria. For semi-automatic selection, a static or dynamic survey is generated for obtaining user preferences for parameters associated with the target feature. The survey results will be used to generate a model that illustrates parameter trade-offs, which will be used to finalize the optimal predictive model for the user.

27 Claims, 15 Drawing Sheets

Related U.S. Application Data

62/641,184, filed on Mar. 9, 2018, provisional application No. 62/641,195, filed on Mar. 9, 2018.

(56) References Cited

U.S. PATENT DOCUMENTS

| | | | |
|---|---|---|---|
| 5,923,553 | A | 7/1999 | Yi |
| 6,610,550 | B1 | 8/2003 | Pasadyn et al. |
| 6,751,519 | B1 | 6/2004 | Satya |
| 6,819,426 | B2 | 11/2004 | Sezginer et al. |
| 6,968,253 | B2 | 11/2005 | Mack et al. |
| 7,117,057 | B1 | 10/2006 | Kuo et al. |
| 7,184,853 | B2 | 2/2007 | Roberts et al. |
| 7,289,214 | B1 | 10/2007 | Li et al. |
| 7,403,832 | B2 | 7/2008 | Schulze et al. |
| 7,842,442 | B2 | 11/2010 | Seltmann et al. |
| 7,873,585 | B2 | 1/2011 | Izikson |
| 7,957,826 | B2 | 6/2011 | Ausschinitt et al. |
| 8,233,494 | B2 | 7/2012 | Amini et al. |
| 8,339,595 | B2 | 12/2012 | Den Boef |
| 9,002,498 | B2 | 4/2015 | Chang |
| 9,087,176 | B1 | 7/2015 | Chang et al. |
| 9,116,442 | B2 | 8/2015 | Adel et al. |
| 2003/0014145 | A1 | 1/2003 | Reiss et al. |
| 2003/0074639 | A1 | 4/2003 | Park et al. |
| 2003/0229410 | A1 | 12/2003 | Smith et al. |
| 2004/0167655 | A1 | 8/2004 | Middlebrooks et al. |
| 2004/0181728 | A1 | 9/2004 | Pellegrini |
| 2004/0233439 | A1 | 11/2004 | Mieher |
| 2008/0057418 | A1 | 3/2008 | Seltmann |
| 2008/0262769 | A1 | 10/2008 | Kadosh et al. |
| 2008/0275586 | A1 | 11/2008 | Ko et al. |
| 2009/0024967 | A1* | 1/2009 | Su .................... G03F 1/36 716/136 |
| 2010/0321654 | A1 | 12/2010 | Den Boef |
| 2013/0054186 | A1 | 2/2013 | Den Boef |
| 2013/0060354 | A1 | 3/2013 | Choi et al. |
| 2013/0110276 | A1 | 5/2013 | Cheng et al. |
| 2013/0208279 | A1 | 8/2013 | Smith |
| 2013/0230797 | A1 | 9/2013 | Van Der Sanden |
| 2013/0282340 | A1 | 10/2013 | Liu et al. |
| 2013/0310966 | A1 | 11/2013 | MacNaughton et al. |
| 2014/0094015 | A1 | 4/2014 | Kasa |
| 2014/0362363 | A1 | 12/2014 | Cai |
| 2015/0161520 | A1* | 6/2015 | Kaushal ........... G05B 19/41885 700/121 |
| 2015/0253373 | A1 | 9/2015 | Callegari et al. |
| 2015/0369857 | A1 | 12/2015 | Nakamura |
| 2018/0275523 | A1* | 9/2018 | Biafore .............. G01N 21/8851 |
| 2022/0180503 | A1* | 6/2022 | Oh ..................... G06F 18/2148 |

OTHER PUBLICATIONS

Pilsung Kang et al., 'Virtual Metrology for Run-to-Run Control in Semiconductor Manufacturing', 2011, vol. 38, pp. 2508-2522, Elsevier, Expert Systems with Application.

William H. Arnold, Towards 3nm Overlay and Critical Dimension Uniformity: An Integrated Error Budget for Double Patterning Lithography, 2008, SPIE vol. 6924, Optical Microlithography XXI, pp. 1-9.

Prasad Dasari, Jie Li, Jiangtao Hu, Nigel Smith and Oleg Kritsun (2011). Diffraction Based Overlay Metrology for Double Patterning Technologies, Recent Advances in Nanofabrication Techniques and Applications, Prof. Bo Cui (Ed.), ISBN: 978-953-307-602-7, InTech, Available from: http://www.intechopen.com/books/recentadvances-in-nanofabrication-techniques-and-applications/diffraction-based-overlay-metrology-for-doublepatterning-technologies.

Peter M. O'Neill et al., 'Statistical Test: A New Paradigm to Improve Test Effectiveness & Efficiency', 2007, pp. 1-10, IEEE International Test Conference. ISBN: 1-4244-1128-9/07.

Ajay Khochel et al., 'A Tutorial on STDF Fail Datalog Standard', 2008, pp. 1-10, IEEE International Test Conference, ISBN: 1-4244-4203-0/08.

Raphael Robertazzi et al., 'New Tools and Methodology for Advanced Parametric and Defect Structure Test', 2010, pp. 1-10, IEEE International Test Conference, ISBN: 978-1-4244-7207-9/10.

Shane A. Lynn, 'Real-Time Virtual Metrology and Control of Etch Rate in an Industrial Plasma Chamber', pp. 1-6; Part of 2012 IEEE Multi-Conference on Systems and Control; Oct. 3-5, 2012. Dubrovnik, Croatia 2012 IEEE International Conference on Control Applications (CCA).

Rao Desineni et al., 'The Grand Pareto: A Methodology for Identifying and Quantifying Yield Detractors in Volume Semiconductor Manufacturing', May 2, 2007, pp. 87-100, vol. 20, IEEE Transactions on Semiconductor Manufacturing.

Pieter Kneilssen et al., Powerpoint Presentation titled 'Litho InSight, a novel approach towards on-product litho performance improvement'; 31 pages, APC Conference XXVI in Ann Arbor, Michigan.

John C. Robinson, Ph.D., 'Intelligent Feed-forward of Non-Litho Errors for 3D Patterning', 20 pages, Sep. 30, 2014, APC Conference XXVI in Ann Arbor, Michigan.

Michael Hackerott, 'Semiconductor Manufacturing and Engineering Data Analysis', 38 pages.

Prasad Dasari et al., 'A Comparison of Advanced Overlay Technologies', 9 pages, 2010, vol. 7638, Metrology, Inspection, and Process Control for Microlithography XXIV, ccc Code: 0277-786X/10, doi: 10.1117/12.848189.

Daewoong An et al., 'A Semiconductor Yields Prediction Using Stepwise Support Vector Machine', Nov. 17-20, 2009, Proceedings of 2009 IEEE International Symposium on Assembly and Manufacturing In Suwon Korea, 7 pages.

Sae-Rom Pak et al., 'Yield Prediction using Support Vectors Based Under-Sampling in Semiconductor Process', pp. 896-900, Dec. 20, 2012, International Scholarly and Scientific Research & Innovation vol. 6, World Academy of Science, Engineering and Technology.

\* cited by examiner

RATIONAL DECISION-MAKING TOOL FOR SEMICONDUCTOR PROCESSES

TECHNICAL FIELD

This disclosure relates generally to semiconductor manufacturing processes, and more particularly, to methods for detecting and classifying wafers using robust modeling of analyzed signals.

BACKGROUND

The semiconductor manufacturing industry is known as a complex and demanding business, and it continues to evolve with major changes in device architectures and process technologies. Typically, the semiconductor industry has been characterized by sophisticated high-tech equipment, a high degree of factory automation, and ultra-clean manufacturing facilities that cost billions of dollars in capital investment and maintenance expense.

Recently, the application of Machine Learning ("ML") algorithms has become popular for use with semiconductor manufacturing processes. Generally, an ML model can be constructed for a specific process parameter by sampling relevant data in order to build one or more training sets of data to represent expected performance of the process with regard to that parameter.

One potential application of ML models is for the timely detection and identification of problematic processing events and/or equipment-related failures. In fact, the identification of such problems is critical for the success of a manufacturing line. Failure/fault detection and control (FDC) at wafer level can potentially enable yield enhancement, improvement of process quality control, reduce manufacturing costs and amount of scrap, as well as improve equipment uptime by identifying systematic issues quickly.

One such method is to utilize sensor data collected during wafer processing to determine the likelihood of a wafer failure downstream. However, the sheer volume and complexity of sensor data collected presents a challenge for robust machine learning models, such as high correlation between multiple process variables and obvious non-linearity of the data. A further challenge is the generalization of such machine learning pipelines towards disparate equipment clusters such as etch, CMP, lithography, deposition and wets.

Therefore, it would be desirable to be able to collect and process input data from sensors and other manufacturing data sources in order to utilize an ML model to predict likely failures.

DETAILED DESCRIPTION

1. Semiconductor Manufacturing Processes Generally

Figure 1:
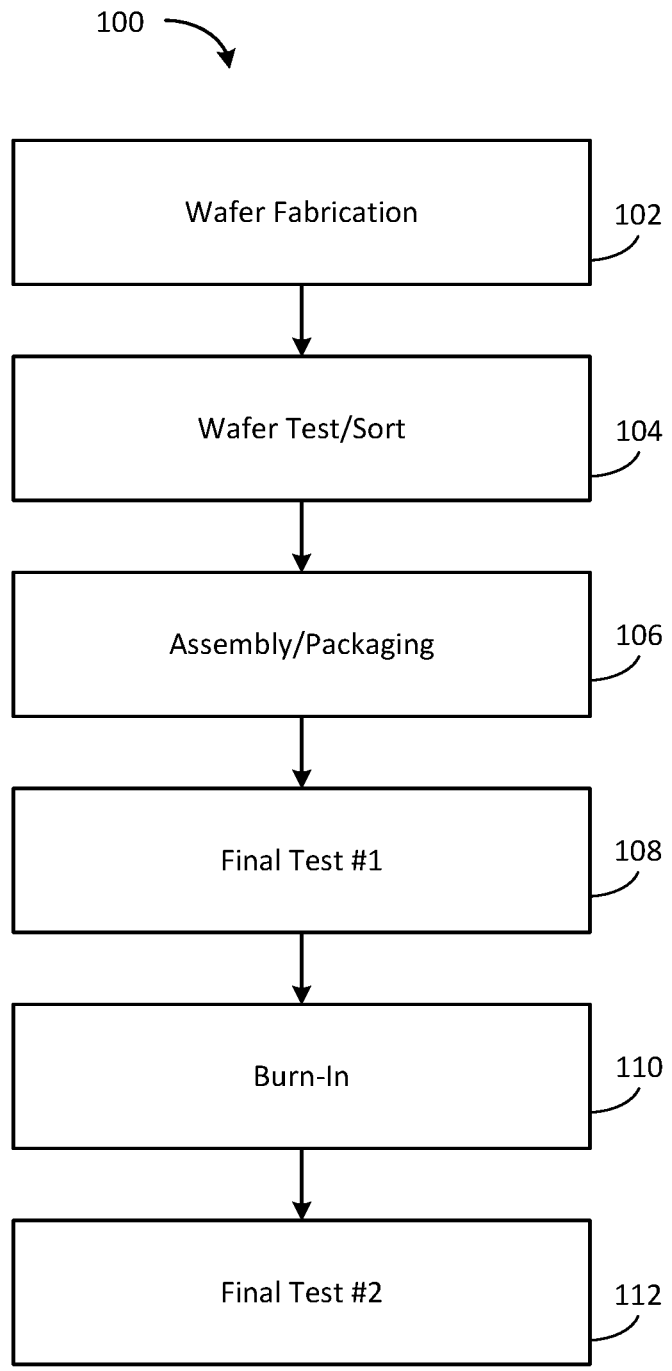
FIG. 1 is a flow chart illustrating a process for making a semiconductor device.

FIG. 1 is a simplified high-level view of a typical semiconductor manufacturing process 100, in which there may actually be hundreds of steps. In general, voluminous amounts of data that represent various aspects of the process can be collected at every step and sub-step of a production run and provided as input data to various forms of systematic analysis. For example, yield and other performance characteristics may be calculated from selected input data for each step, as well as predictions made for key processing parameters for the entirety of the process.

Wafer fabrication occurs in step 102, wherein a large number of integrated circuits are formed on a single slice of semiconductor substrate, such as silicon, known as a wafer. Many steps are required in various sequences to build different integrated circuits. For example, deposition is the process of growing an insulating layer on the wafer. Diffusion is the process of baking impurities into areas of the wafer to alter the electrical characteristics. Ion implantation is another process for infusing the silicon with dopants to alter the electrical characteristics of the silicon.

In between these steps, lithographic processing allows areas of the wafer to be patterned with an image, then a mask is used to expose photoresist that has been applied across the wafer, and the exposed photoresist is developed. The pattern is then etched to remove selected portions of the developed photoresist, and these steps are repeated to create multiple layers. Finally, metallization is a specialized deposition process that forms electrical interconnections between various devices/circuits formed on the wafer. The fabrication process can take several months to complete before moving on to the post-fabrication steps.

Wafer acceptance testing (WAT), also known as process control monitoring (PCM), occurs in step 104. After a wafer has been fabricated, all the individual integrated circuits that have been formed on the wafer are tested for functional defects, for example, by applying test patterns using a wafer probe. Circuits may either pass or fail the testing procedure, and failed circuits will be marked or otherwise identified, e.g., stored in a file that represents the location of the failed circuits on a wafer map.

Assembly and packaging takes place in step 106. The wafer is diced up into separate individual circuits or dies, and each die that passes through wafer sort and test is bonded to and electrically connected to a frame to form a package. Each die/package is then encapsulated to protect the circuit.

In step 108, the packages are subjected to random electrical testing to ensure that circuits in the package are still working as expected. In step 110, the remaining packages go through a burn-in cycle by exposing the package to extreme but possible operating conditions. Burn-in may involve electrical testing, thermal exposure, stress screening, or a combination of these, over a period of time. Burn-in testing reveals defective components. Finally, in step 112, a final round of electrical testing is conducted on the remaining packages.

2. Machine Learning Algorithms

Recent advances in computing technologies and data analysis techniques, such as performing parallel processing on a massive scale, has led to progress in machine learning algorithms, data mining, and predictive analytics. Machine Learning ("ML") is a branch of Artificial Intelligence (AI) that involves the construction and study of systems that can learn from data. Generally, a Machine Learning or ML model can be constructed for a specific process parameter by sampling relevant data in order to build one or more training sets of data to represent expected performance of the process with regard to that parameter. ML algorithms, along with parallel processing capabilities, allow for much larger datasets to be processed, without the need to physically model the data. Such techniques are much better suited for multivariate analysis. Furthermore, confidence and propensity metrics associated with many ML algorithms make it possible to optimize wafer sort/testing, final tests, and burn-in activities.

Data has always played an important role in semiconductor and electronics manufacturing. In the semiconductor industry, data was initially collected manually to track work-in-progress ("WIP"). The types of data collected included metrology data (measurements taken throughout the IC fabrication process), parametric test data, die test data, final test data, defect data, process data, and equipment data. Standard statistical and process control techniques were used to analyze and utilize the datasets to improve yields and manufacturing efficiencies. In many instances, the analysis was performed in a manual "ad-hoc" fashion by domain experts.

However, as device nodes became smaller and tolerances became tighter, factories became more automated and the ability to collect data improved. Even with this improvement in the ability to collect data, it has been estimated that no more than half of the data is ever processed. Further, of the data that is processed and stored, much of it is never again accessed.

Moving forward, data volume and velocity continues to increase rapidly. In addition to faster data rates, there are also more sensors being deployed in the semiconductor manufacturing process. Given the massive amount of sensor data now collected, and the low retention rates of the data, advancements in data science could and should be implemented to solve the problems of the semiconductor industry. Some progress has been made to leverage data to improve efficiencies in the semiconductor and electronics industries. For example, microchip fabrication factories are combining and analyzing data to predict when a tool for a particular process needs maintenance, or to optimize throughput in the fab.

Predictive analytics and ML algorithms can thus be used to address many of the challenges facing the semiconductor industry. By drilling deeper into the details of semiconductor manufacturing and knowing how to apply predictive analytics to detect and resolve process issues faster, and to tighten and target the specifications of individual manufacturing steps, increased process efficiencies can result. Some of the known ML algorithms include but are not limited to: (i) a robust linear regression algorithm, such as Random Sample Consensus (RANSAC), Huber Regression, or Theil-Sen Estimator; (ii) a tree-based algorithm, such as Classification and Regression Tree (CART), Random Forest, Extra Tree, Gradient Boost Machine, or Alternating Model Tree; (iii) a neural net based algorithm, such as Artificial Neural Network (ANN), Deep Learning (iv) kernel based approach like a Support Vector Machine (SVM) and Kernel Ridge Regression (KRR); and others.

Some earlier efforts of the applicant are described in the following publications, each of which is incorporated herein in its entirety: U.S. Publication No. 2016/0148850 entitled Process Control Techniques for Semiconductor Manufacturing Processes; U.S. Publication No. 2017/0109646 entitled Process Control Techniques for Semiconductor Manufacturing Processes; U.S. Publication No. 2018/0358271 entitled Process Control Techniques for Semiconductor Manufacturing Processes; U.S. Publication No. 2018/0356807 entitled Generating Robust Machine Learning Predictions for Semiconductor Manufacturing Processes; and U.S. Publication No. 2019/0064253 entitled Semiconductor Yield Prediction.

3. Failure Detection and Classification

Figure 2:
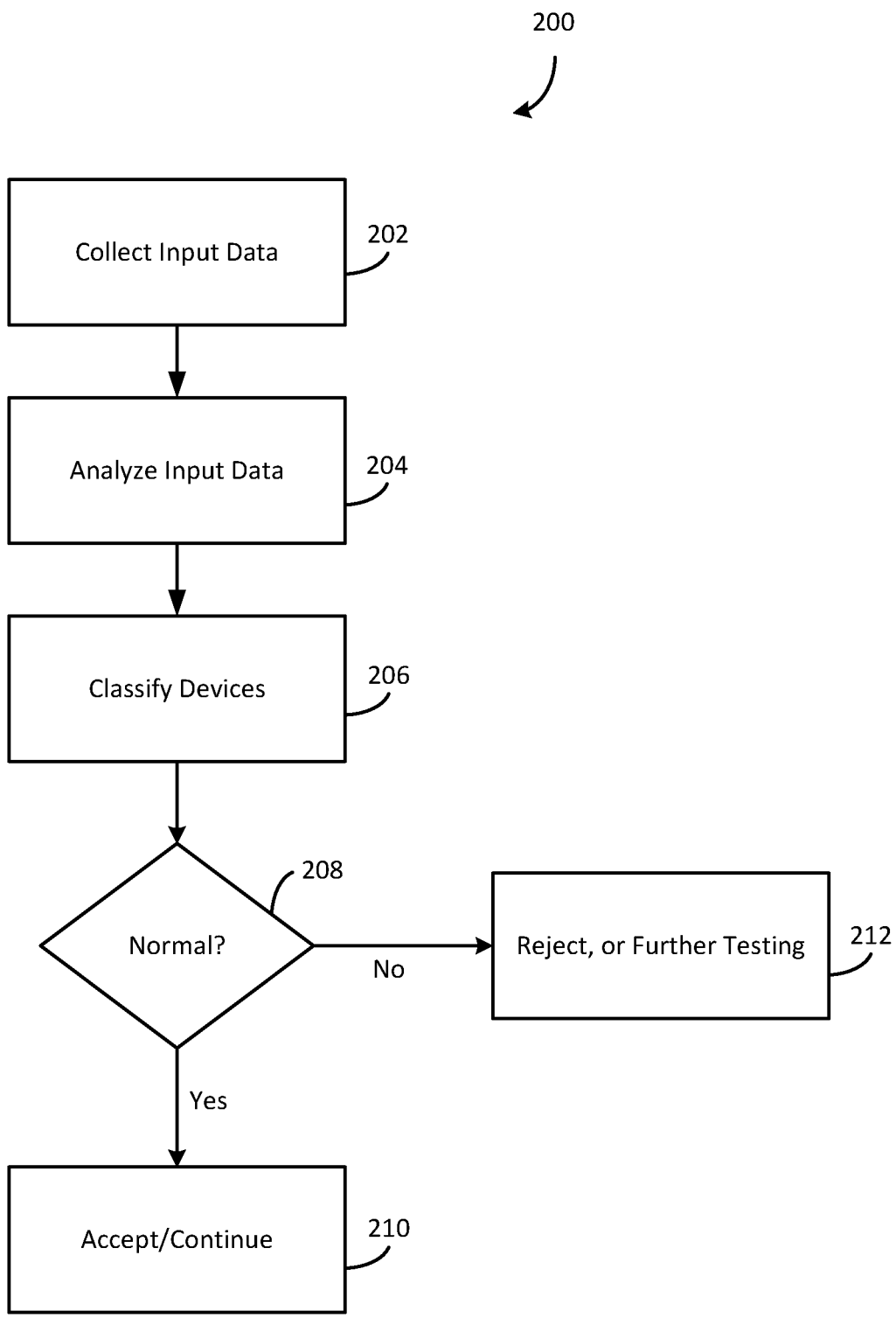
FIG. 2 is a flow chart illustrating a process for failure detection and classification.

Practical schemes for Failure Detection and Classification ("FDC") (also known as Fault Detection and Classification) for semiconductor manufacturing processes are critical for improving manufacturing yield and reducing cost. FIG. 2 illustrates a process 200 wherein input data including signals from sensors and other data sources are collected in step 202 during a production run for a particular semiconductor process. In step 204, the input data is analyzed using machine learning techniques to identify key features and/or characteristics of the data in order to classify wafers and/or lots of semiconductor devices. In step 206, the wafers or devices are classified based on the analysis of step 204. If the wafers or devices are classified as normal in step 208, the wafers or devices are accepted or processing is continued in step 210. If the wafers or devices are not classified as normal in step 208, they are deemed abnormal, and the wafers or devices are either rejected in step 212, or processing is discontinued, or further testing is performed to determine whether the wafers or devices will be rejected.

Figure 3:
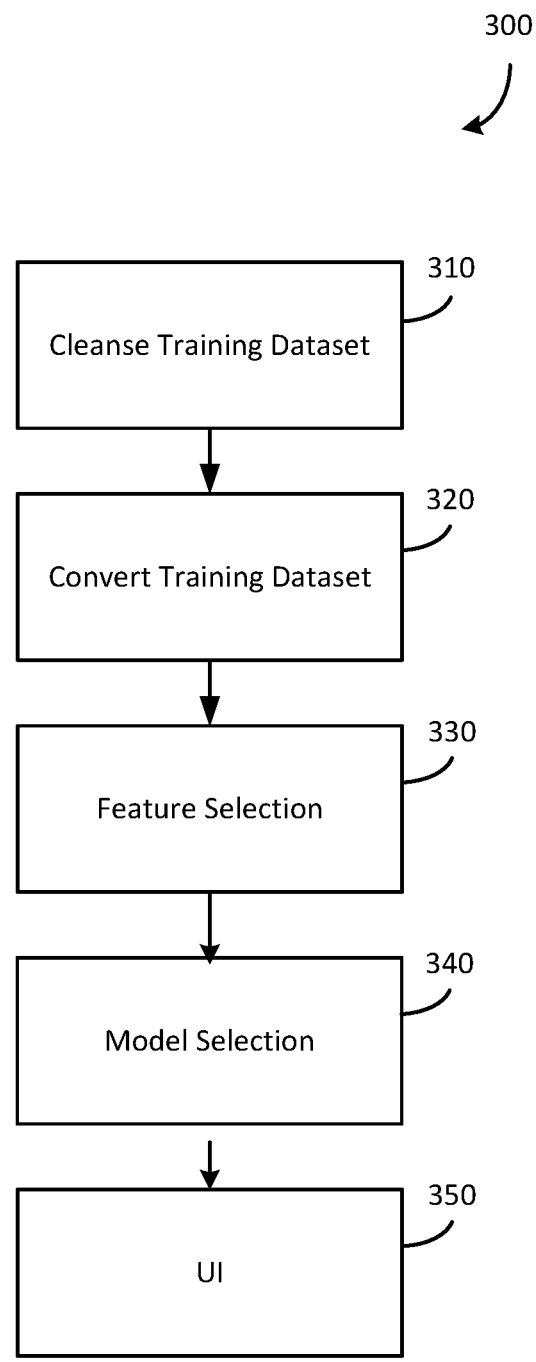
FIG. 3 is a block diagram illustrating a pipeline or workflow for failure detection and classification.

For example, FIG. 3 is a flow diagram illustrating an FDC pipeline 300 that uses machine learning to generate a predictive model (or prediction engine) that is both highly accurate and robust in performing FDC activities. The FDC pipeline 300 includes a first pipe 310 configured for cleansing the dataset used to train a machine learning model, in particular, to remove unwanted data and features from the dataset. However, the first pipe 310 is not necessary if the data is already clean, e.g., cleaned by the customer before being received for FDC processing. In a second pipe 320, the training dataset is converted into useful target features. For example, time series data can be converted using customized complex feature engineering. These feature engineering techniques could include, but are not limited to:

(a) a statistics-based feature, like minimum, maximum, and 10-90 percentile range;

(b) a frequency-based feature, like maximum amplitude, frequency at maximum amplitude, and phase at maximum amplitude from a Fast Fourier Transform (FFT);

(c) a control-based feature, like overshoot, settling time, and steady state value (see example from <www.mathworks.com/help/control/ref/stepinfo.html>);

(d) wavelet-based features, like wavelet coefficients; and (e) regression-based features, like coefficient of fit and mean square error.

A third pipe 330 implements a method for coherent and efficient feature selection. A fourth pipe 340 implements a model selection method that allows for a trade-off between false positive results and false negative results, typically dependent on customer-specific criteria. Finally, in a fifth pipe 350, a user interface is provided that allows customers to interact with the system, for example, through a command line interface ("CLI"), an application programming interface ("API") and/or a graphical user interface ("GUI"). The fifth pipe 350 is not necessary if the system is fully automated without any input or verification of model performance by the customer.

In one embodiment, an FDC predictive model for an automated system is generated by combining the three middle steps, i.e., converting the dataset in step 320, selecting features in step 330, and selecting a model in step 340. If data cleansing is required, then step 310 can be added. If customer input or verification is required, then step 350 can be added.

The components of the FDC pipeline 300 can be used for detecting and classifying a wafer or lot as normal or abnormal. Customers can then use this classification to select wafers for continued processing, or to stop further processing on certain wafers, which of course helps reduce cost by avoiding unnecessary further processing.

Customers can also use this classification to select wafers to send for further testing or further investigative actions, including destructive testing, that could reveal valuable information that helps improve the robustness of the processes and designs. Customers can use the total predicted amount of abnormal and normal wafers for downstream resource planning.

The FDC pipeline 300 can also be used as a diagnostic tool for process equipment by determining the critical sensor and manufacturing steps that are causing wafers to be abnormal. This determination can improve a root cause analysis, which is not limited to equipment part failure, sensor degradation, seasonality, etc. This diagnostic tool can be embedded into a Visual Analytic tool, such as Tableau and SpotFire, so that the diagnostic results presented to a customer are easier to understand.

The FDC pipeline 300 can be used as a prognostic/preventive maintenance tool for process equipment by combining temporal trends in wafer prediction with drift and shift data in sensor measurements and ML features.

The data cleansing pipe 310 can be an initial part of preparing the data for generation of an FDC model, in particular, to remove any wafer data having data collection issues, but as noted above, is not necessary if the customer provides clean data. For example, data is collected from numerous sources during a wafer production process. During deployment of the ML model for the wafer production process, issues arising from analysis of the data collection are caught by an excursion handler, and do not necessarily impact the FDC prediction.

A simple approach for automatic data cleansing is to use an anomaly detection algorithm for detecting data quality issues in wafer production. Anomaly detection methods can be applied to remove unusual sensor measurements from the training set. These anomalous measurements can be caused by a number of different causes, such as faulty sensors, bad endpoint detection that terminates the data collection process too early or too late, etc. The anomaly detection methods can include but are not limited to: statistical outlier detection for individual or multivariate signals; detection of an unusually short or long duration of signal relative to other similar signals; detection of missing critical manufacturing steps or process(es) for a given dataset or process recipe; and multidimensional outlier detection of unusual coupling of sensor signals that could possibly indicate underlying issues.

The feature generation pipe 320 converts time series data and other types of data into features that capture information in a manner that enables machine learning algorithms to detect normality/abnormality of a wafer easily and reliably. Methods can include but are not limited to: (i) statistical methods, (ii) control theory, (iii) frequency analysis, (iv) wavelets, and (v) coefficients from parametric fits such as spline or curve fits.

Additionally, methods to pre-process data can include but are not limited to the following: (i) time series segmentation (including based on known manufacturing steps or automatic detection of sharp changes in signal measurements), (ii) dynamic time warping to align signals, and (iii) denoising of signal using filters such as Kalman filters.

The feature selection pipe 330 can be implemented for hierarchical variable selection, for example, by making an early determination as to which sensors and/or manufacturing steps may not be providing useful data for training the ML model, and to remove them from training the model. Also, a forward variable selection scheme can be implemented in which the selected manufacturing steps and sensors are minimized in the model. These steps can greatly enhance the interpretation of the final FDC predictive model.

Figure 4:
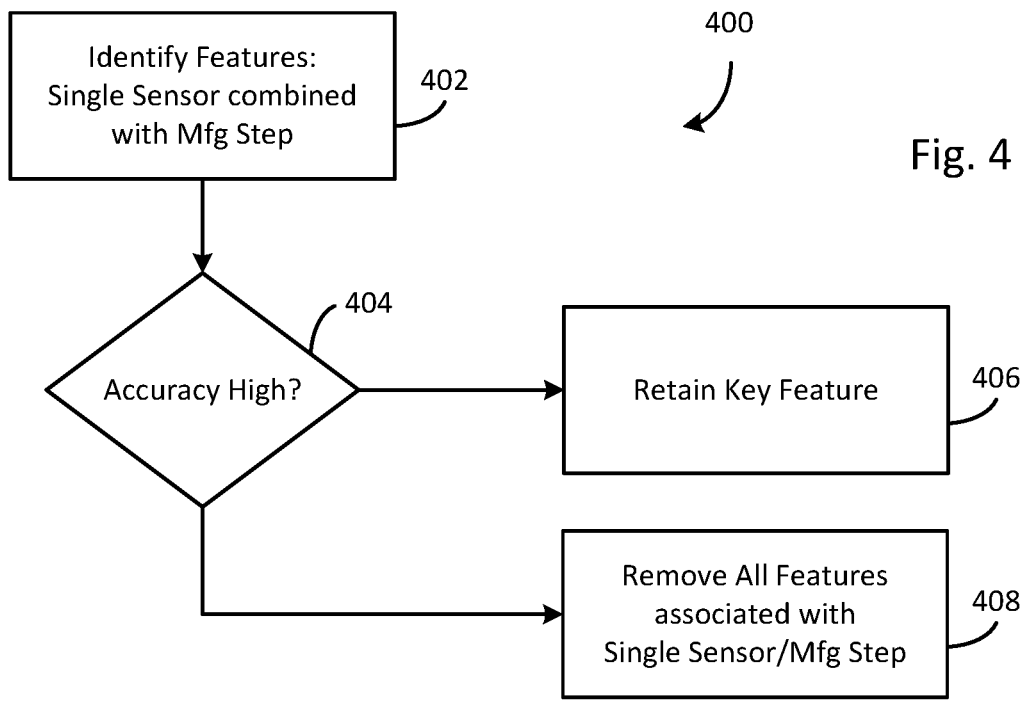
FIG. 4 is a flow chart illustrating a first embodiment for retaining or removing features from the training dataset.

For example, FIG. 4 illustrates a process 400 for detecting and removing sensors that are useless for FDC predictions. In step 402, models can be built using target features identified from a single sensor and manufacturing step combination. If the best cross-validation accuracy of the data received from the target features is reasonably high in step 404, a key feature can be identified and retained from this single sensor and manufacturing step combination in step 406. If best cross-validation accuracy is low in step 404, however, all features generated from this sensor and manufacturing step combination can be removed from further modeling in step 408.

Figure 5:
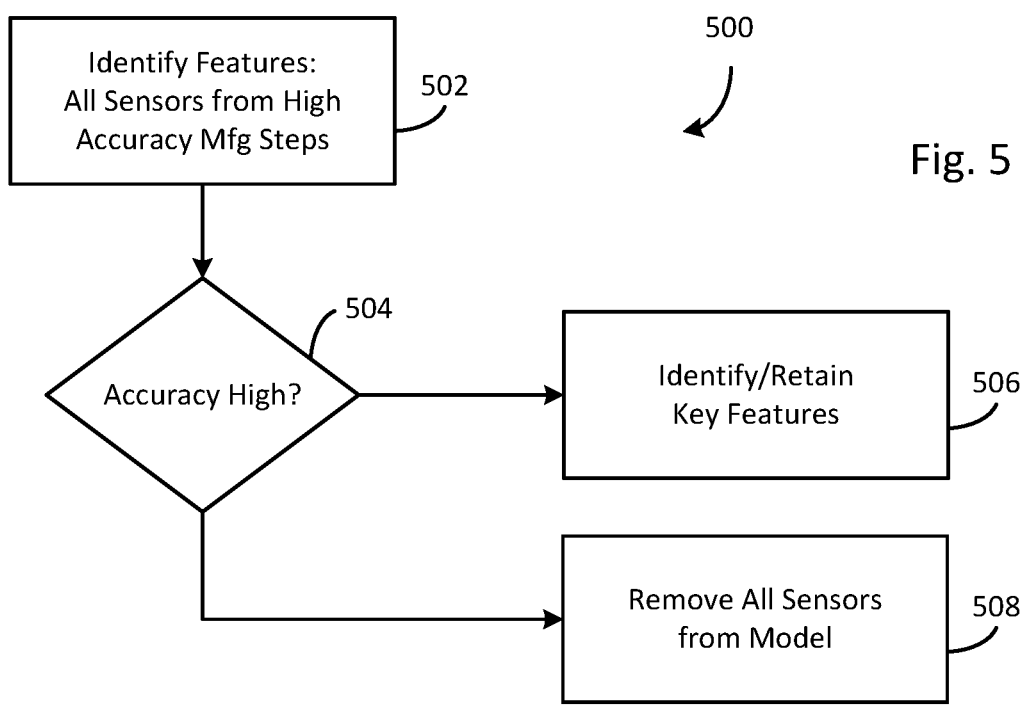
FIG. 5 is a flow chart illustrating a second embodiment for retaining or removing features from the training dataset.
Figure 6:
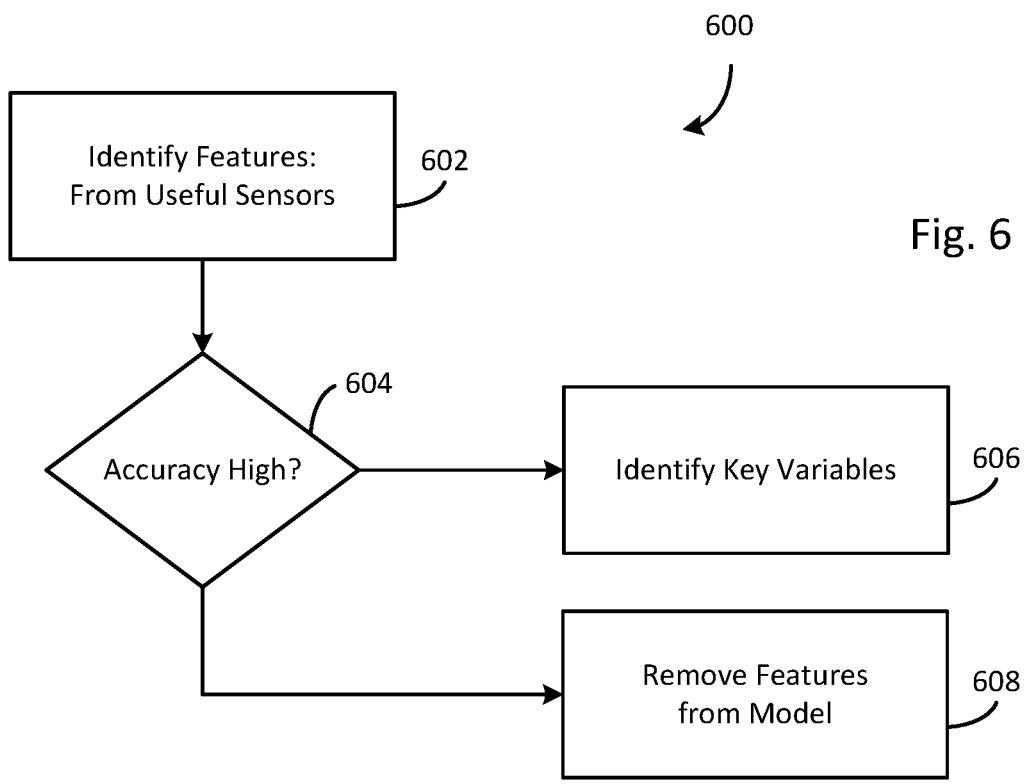
FIG. 6 is a flow chart illustrating a third embodiment for retaining or removing features from the training dataset.

Another process 500 is illustrated in FIG. 5. In step 502, models can be built from data for each sensor using all of key features from manufacturing steps that produced reasonably high accuracy. If the best model has high accuracy in step 504, a number of key variables for the sensor can be determined and retained for use with the model in step 506, otherwise, the sensors associated with these manufacturing steps are removed from further modeling in step 508.

A third process 600 in the hierarchical scheme builds models in step 602 using all of the features from sensors considered to provide good modeling data. If the accuracy of the model is high for these sensors in step 604, key variables are identified in step 606. If the accuracy is not high in step 604, the features are removed from the model in step 608.

For example, methods such as Kolmogorov-Smirnov distance test, Spearman's rank-order correlation, Area under the Curve ROC with true positive rate, false positive rate, precision and recall, and F1-scores may be used to determine if a particular sensor or manufacturing step contains statistically different distributions between normal and abnormal wafers. It is also possible to identify such sensors, steps or features by determining the ratio of abnormal to normal wafers, and removing data from the ML model training set that contains insufficient information or too few abnormal wafers. Similarly, useless and irrelevant manufacturing steps can also be detected by identifying manufacturing steps that have a fraction of abnormal wafers that is "too small" statistically.

As with any failure detection and classification problem, there are different costs and considerations associated with detection of false positive and false negative results for semiconductor wafer classification. In other words, when a normal wafer is classified as abnormal, good wafers may be lost. Further, when an abnormal wafer is classified as normal, the process bears the cost of further processing of the bad wafer.

The Area Under the Curve (AUC) Receiver Operating Characteristic (ROC) curve is a well-known tool for evaluating the performance of a classification model, and may be used to generate an automatic rank ordering of FDC model performance. The AUC-ROC curve typically correlates well with the robustness of the model in production. Thus, customers can choose how they want trade-off different detection criteria, and the final model selection can be user-triggered through a GUI or automatically by using predefined user specifications.

All of the pipes described above can be achieved via a Command Line Interface (CLI), interacted with via an Application Programming Interface (API), and displayed via a Graphical User Interface (GUI) as part of pipe 350. The API provides the programmatic interface to customers, and systems can be configured to provide automation in the interface if desired. The GUI can utilize visual analytics to present information pertinent for user review and provide interactivity to enable better decisions by customers. The GUI can also display warnings and additional diagnostics or information about status or health of data & models, as well as results of the FDC process in light of customer-defined specifications.

Figure 7:
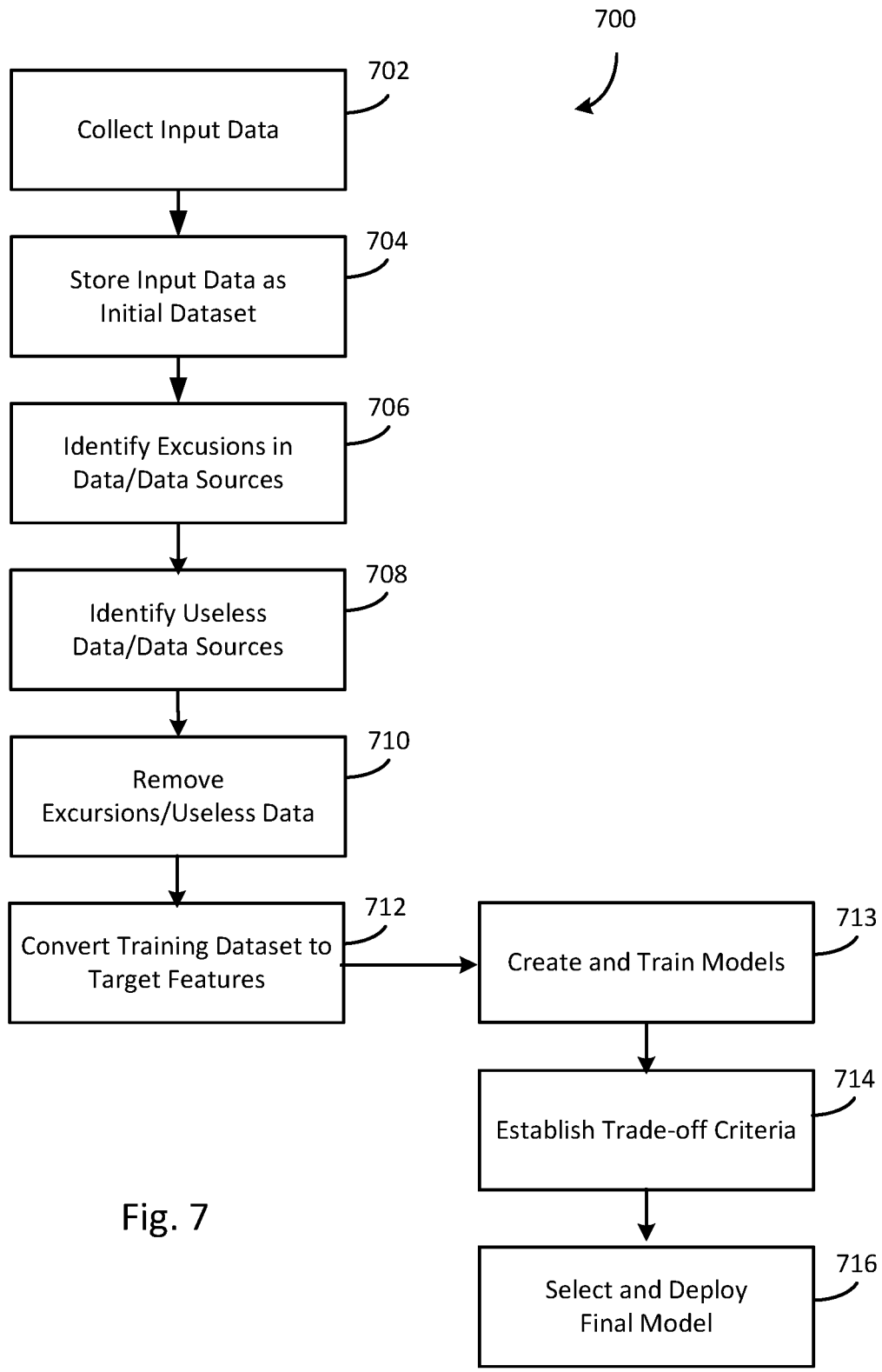
FIG. 7 is a flowchart illustrating a more detailed process for failure detection and classification that is shown in FIG. 2.

FIG. 7 illustrates an exemplary process 700 for generating a predictive model for failure detection and classification. In step 702, input data is collected from many data sources during a production run for semiconductor devices. In step 704, the input data is stored as an initial dataset for generating and training of one or more predictive models using machine learning techniques. In step 706, the input data is evaluated to identify data sources for which an excursion was detected during the production run. In step 708, the input data is evaluated to identify data sources that are basically useless, that is, that have negligible effect on the predictive model. In step 710, the unwanted input data is removed from the initial dataset to form the training dataset.

In step 712, the training set is converted into desirable target features. For example, target features are identified that capture information that is useful in making a determination that the devices produced are normal or abnormal. In step 713, multiple models are created and each trained with one or more training datasets. In step 714, trade-off preferences for false positive and false negative results are established based on user selection or criteria and applied to the models. Finally, in step 716, a final model is selected and deployed.

4. Improved Excursion Handling

In the semiconductor industry, the term "excursion" is typically used to describe a condition in which a process or equipment drifts outside of performance specification. However, as used in this disclosure, the term "excursion" is used more broadly to describe any risk or event that could cause a reduction in microchip, wafer, or lot level yield. Excursion handling is one of the key components for semiconductor process quality control such that any improvement in excursion handling could result in significant cost reduction and/or product throughput. Although identifying an excursion is important, it is also critical to find the root cause of the excursion so that the manufacturing line can fix the issue quickly.

In one embodiment, methods for identifying root cause are combined with data driven excursion detection and classification algorithms to provide a more robust excursion handling method.

The first task is to identify the root cause for every process excursion. The root cause for a process excursion can include (i) a root cause that is general in nature that shows up in most semiconductor tools, and (ii) a root cause that is specific for particular sets of tools and recipe combinations. These root causes can be identified by any of following approaches.

A. Root Cause Detected During Design Phase

When designing, developing, and producing equipment, equipment reliability can be analyzed. The root cause and impact of a failure mode can be obtained by using known techniques, such as Failure Mode and Effects Analysis (FMEA) or Failure Mode, Effects and Criticality Analysis (FMECA) reports.

B. Root Cause from Historical Data

If there are logs from past failures, the root cause analysis for those failures can classify and group root causes in coherent groups.

C. Combination of Design Phase Detection and Historical Data

The two approaches described above complement each other. Some root causes of rare failure modes may not have happened yet, but are known during the design phase, while other root causes may not be detected during the design phase, but have happened in past usage. Thus, if a root cause can be obtained from both FMEA and historical data, it is useful to combine root cause from both sets.

The second task is classification of the excursion. Data collected from the wafer fabrication facility is available from the logs and sensor measurements associated with the fabrication process. This data, which includes both textual data from the logs and temporal or spatio-temporal data from the sensor measurements, can be transformed using a relevant feature engineering process to build a list of critical key words and phrases. For example, log data could be parsed using Natural Language Processing (NLP) and Text Mining techniques to convert the log data into features. Temporal data analysis could be transformed using a time series analysis like Autoregressive Integrated Moving Average (ARIMA), Kalman Filter, Particle Filter, etc. to extract relevant features. Spatio-temporal data could utilize an event-based approach, a clustering-based approach, a network (graph) analysis approach, etc. to generate relevant features. The transformation step is usually followed by a multi-class classification scheme to detect and classify the excursions. For example, data from a "normal" operation condition should be added to the ML model training set such that a "normal" class is one of the possible predictions of the model.

Figure 8:
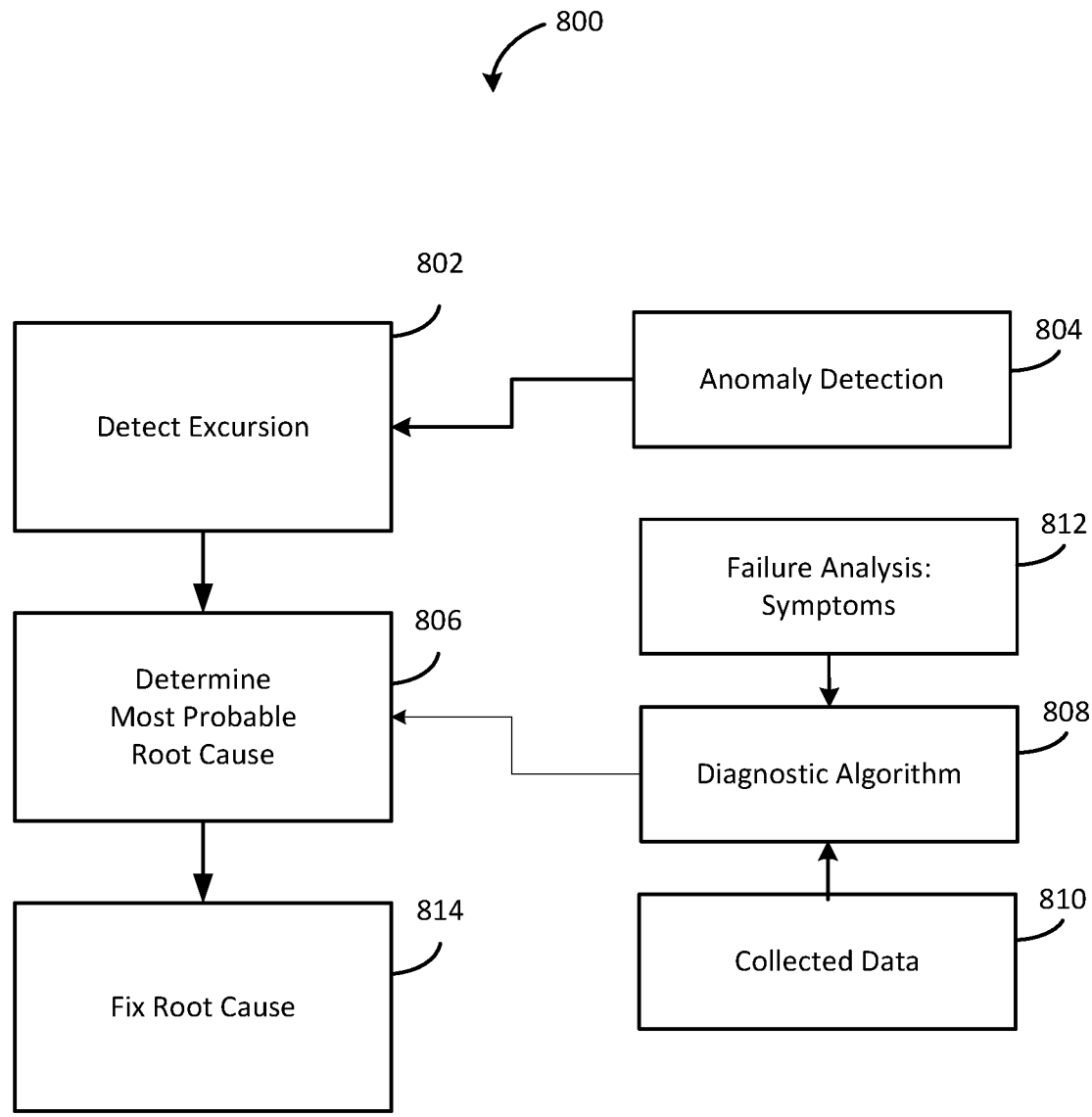
FIG. 8 is a flow chart illustrating a process for determining the most probable root cause of an excursion.

However, the typical multi-class classification scheme only addresses detection for root cause with historical data. In order to detect a failure of a known but not previously detected failure mode and classify the root cause, the method 800 illustrated in FIG. 8 can be used. In step 802, an excursion is detected, for example, using an anomaly detection scheme in step 804. In one scenario, the excursion may not be classified as a known failure by the existing multiclass classification scheme, and thus, in step 806, the most probable root cause is determined. The determination of most probable root cause is made using a diagnostic algorithm in step 808 to combine the physical evidence, i.e, the collected data in step 810, with symptoms that have been identified using a failure mode analysis in step 812, e.g., a failure mode and effects analysis ("FMEA") and/or a known failure mode, effects and criticality analysis ("FMECA"). Once the most probable root cause has been identified in step 806, it may be fixed in step 814.

The diagnostic algorithm could be selected from a variety of algorithms that handle imprecise information, such as the Dempster-Shafer evidence theory-based diagnostic (see e.g., O. Basir and X. Yuan, Engine Fault Diagnosis Based On Multi-Sensor Information Fusion Using Dempster-Shafer Evidence Theory, Information Fusion, vol. 8, no. 4, pp. 379-386, 2007); an assumption based system (see, e.g., J. De Kleer, An Assumption-Based TMS, Artificial Intelligence, vol. 28, no. 2, pp. 127-162, 1986); and a Petri Net-based diagnostic (see, e.g., M. P. Cabasino, A. Giva, M. Pocci, and C. Seatzu, Discrete Event Diagnosis Using Labeled Petri Nets. An Application To Manufacturing Systems, Control Engineering Practice, vol. 19, no. 9, pp. 989-1001, 2011).

By combining the data-driven classification approach with model-based diagnostic approach, the root cause of a wider variety of failure modes can be captured with higher accuracy.

5. Rational Decision-Making Tool

There is a trend toward formalizing the decision-making process such that the rationale behind business decisions is understandable and justifiable. However, there is a lot of literature showing how bad decision makers are at actually making a rational decision. Austin-Breneman, Jesse, Tomonori Honda, and Maria C. Yang. "A Study of Student Design Team Behaviors in Complex System Design." Journal of Mechanical Design 134, no. 12 (Nov. 15, 2012): 124504.

More recent understanding of the irrationality of decision-making behavior has resulted in popularizing the concept of bounded rationality. This concept is an acknowledgement that the decision maker's decision may have been rational and justifiable given the limited access or understanding of the information, but nevertheless the decision was sub-optimal and irrational based on all the available information. Thus, if the decision maker had access to and understood all the relevant information, a better decision would have been made. Thus, it is important to provide and display the information to the decision maker as easy to consume and understand information.

There are a variety of known decision-making tools available for helping to make rational decisions. Some tools are designed for capturing the rationality, while others help with finding Pareto-optimal solutions. For example, the Design Rational Editor (DRed) software, developed in collaboration between University of Cambridge and Rolls-Royce, is designed to be a "bookkeeper" of the rationale behind each made decision. Thus, the DRed software is not designed to improve the decision-making process per se, but instead is designed to understand mistakes that were previously made so that applicable system models can be adjusted such that the same or similar mistakes will not happen again.

There are few design tools that show design alternatives within Pareto Frontiers. For example, DARPA at one point sponsored an Adaptive Vehicle Make (AVM) program (see <www.darpa.mil/program/adaptive-vehicle-make>) with an aim to improve the design process for complex system design. Unfortunately, none of these generic rational decision tools are yet available in the open market because they are specific to particular industries and applications.

This description provides a method for guiding a user in rationally selecting predictive models for semiconductor manufacturing applications. By restricting the application space, it is feasible to define the key performance trade-offs in a rational manner.

There are few different formal theories for rational decision making in economics and design theory including, but not limited to, utility theory, multi-attribute utility theory, and preference-based approach such as the Method of Imprecision. Although each of these have different trade-off mechanisms, it is important to understand that any point in the Pareto Frontier should be justifiable for selection, while the dominated points are not a justifiable choice. Additionally, some objective such as economic impact of reducing Return Merchandise Authorization (RMA) may not be easily translated into monetary values. Different rational decision theory can account for these trade-offs that may not be easily translated into monetary values. A graphical user interface (GUI) can be provided to assist the user in identifying and providing input data and selection criteria, and for making a visual analysis of the results.

Figure 9A:
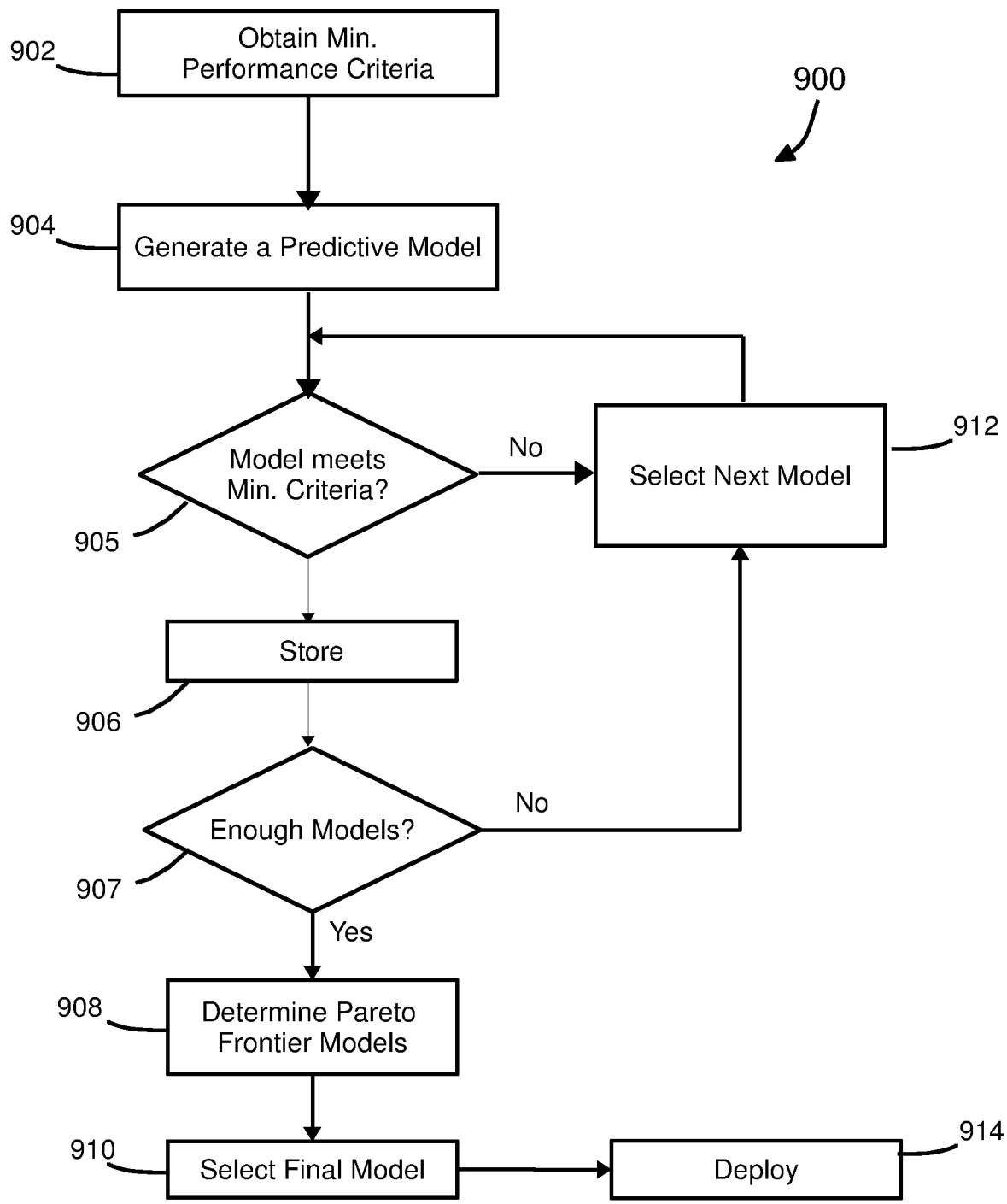
FIG. 9A is a flow chart illustrating a process for selecting a predictive model.

The basic steps for building a first embodiment of a robust predictive model with rational decision making that is production-worthy is illustrated in FIG. 9A. In step 902, minimum performance criteria for the target feature(s) are obtained for a predictive model (including a machine learning model, pattern recognition model, physics-based Model, hybrid model, etc.). These criteria include but are not limited to training speed, prediction speed, accuracy, false positive rate, false negative rate, recall, precision, F1 score, F2 score, F-N score, root mean square error, root mean square log error, mean absolute error, worst case error, robustness, generalizability, etc.

In step 904, a predictive model is generated for predicting relevant target features. If the results from the predictive model meet the minimum performance criteria in step 905, such as False Positive Rate (FPR) of 0.1% and False Negative Rate (FNR) of 1%, the model is saved in step 906 for use in the comparative analysis described below. Other performance criteria could be used, including Area under the Curve (AUC), Area under the Precision-Recall curve, F1 Score, Skip Rate, etc. In step 907, if additional predictive models are needed for an adequate analysis, another predictive model is generated for predicting relevant target features using a different methodology in step 912, and then compared as before to the minimum performance criteria in step 905. It should be noted that different methodologies include different algorithms and mathematical functions including statistical solutions that may be implemented as machine learning models with supervised learning and reinforced learning.

If an adequate number of different predictive models have been generated for a reasonable analysis in step 907, then a set of corresponding models is determined in the Pareto Optimal Frontier in step 908.

Figure 10:
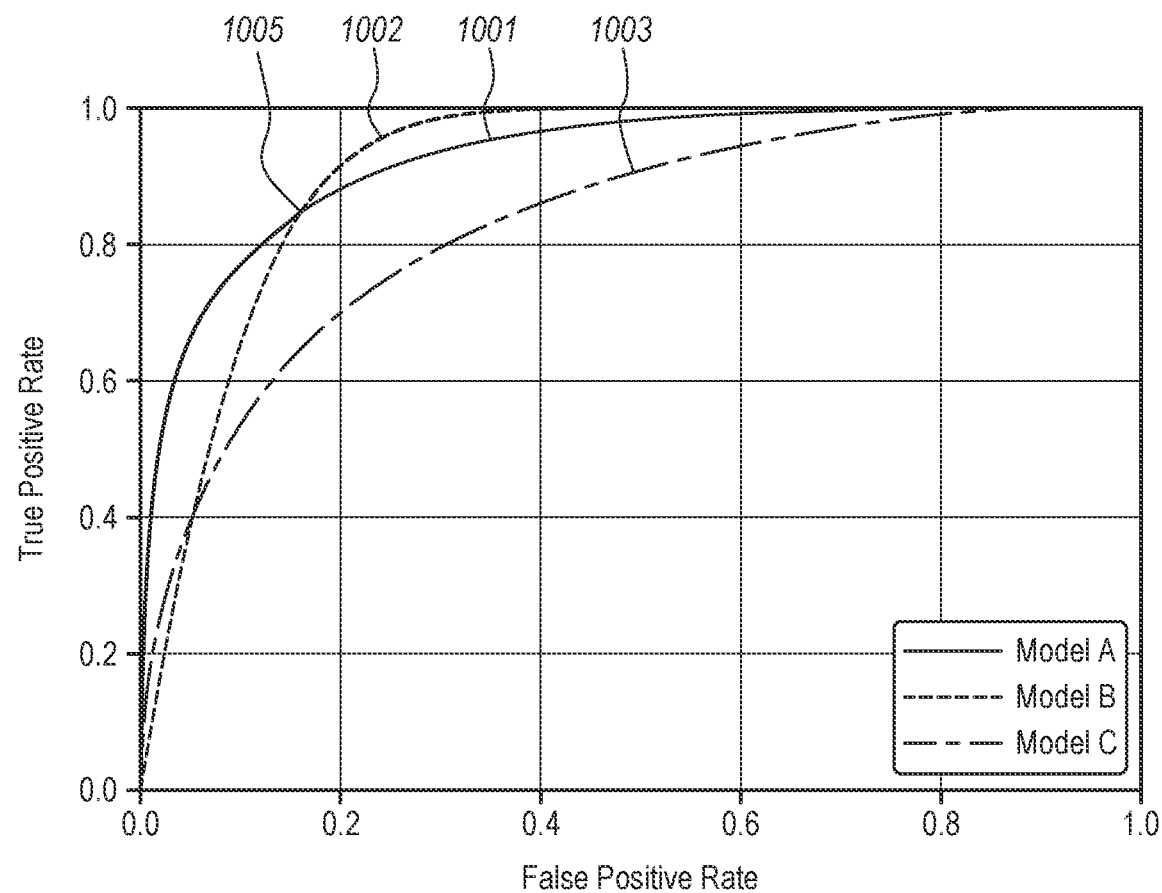
FIG. 10 is a graphical example of a Pareto Frontier having multiple models plotted as a function of true positive results and false positive results.

An example of the Pareto Frontier that could be displayed on a GUI is shown in FIG. 10, where model A 1001, model B 1002, and model C 1003 are plotted as a ROC (Receiver Operating Characteristic) curve, i.e., as a function of true positive results along the y-axis and false positive results along the x-axis. In this example, model C 1003 would be a poor choice and should never be chosen since it is a Pareto dominated model with the least number of true positives and the highest number of false positives. The point 1005 at which model A 1001 and model B 1002 intersect represents a transition point or an indifference point for a comparison of those models in the model selection process. At point 1005, the criteria trade-off is considered virtually identical for model A 1001 and model B 1002. If a customer prefers a lower false positive rate over a higher true positive rate, they should choose model A 1001. If a customer prefers to improve the true positive rate over minimizing the false negative rate, they should choose model B 1002. At a high level, the multiple models in the Pareto Frontier set are predictive models that can be readily justified as a rational choice from a simple visual observation of the graphical results.

Returning to FIG. 9A, the final predictive model is selected in step 910 from models within the Pareto set. The selection may be made in different ways, i.e., manually through user interaction with the GUI or automatically through machine decision. In one embodiment, the user manually selects the final model through visual inspection on the GUI of the data for the modeled device, such as the Pareto models graph of FIG. 10 for example. Incorporating an analytics front end that supports visual analytics techniques into the GUI helps to better inform the user for making rational decisions by providing the ability to display or dig down deeper into any of the data that supports the model. Finally, in step 914, the selected model is deployed for use with a customer application.

The semi-automatic selection approach is based on customer-provided trade-off considerations for parameters of interest. Yield and its related economic impact are often the primary customer concern to decide and set limits related to how many wafers or chips to test again, or to redirect to less critical applications, or to throw away.

Figure 9B:
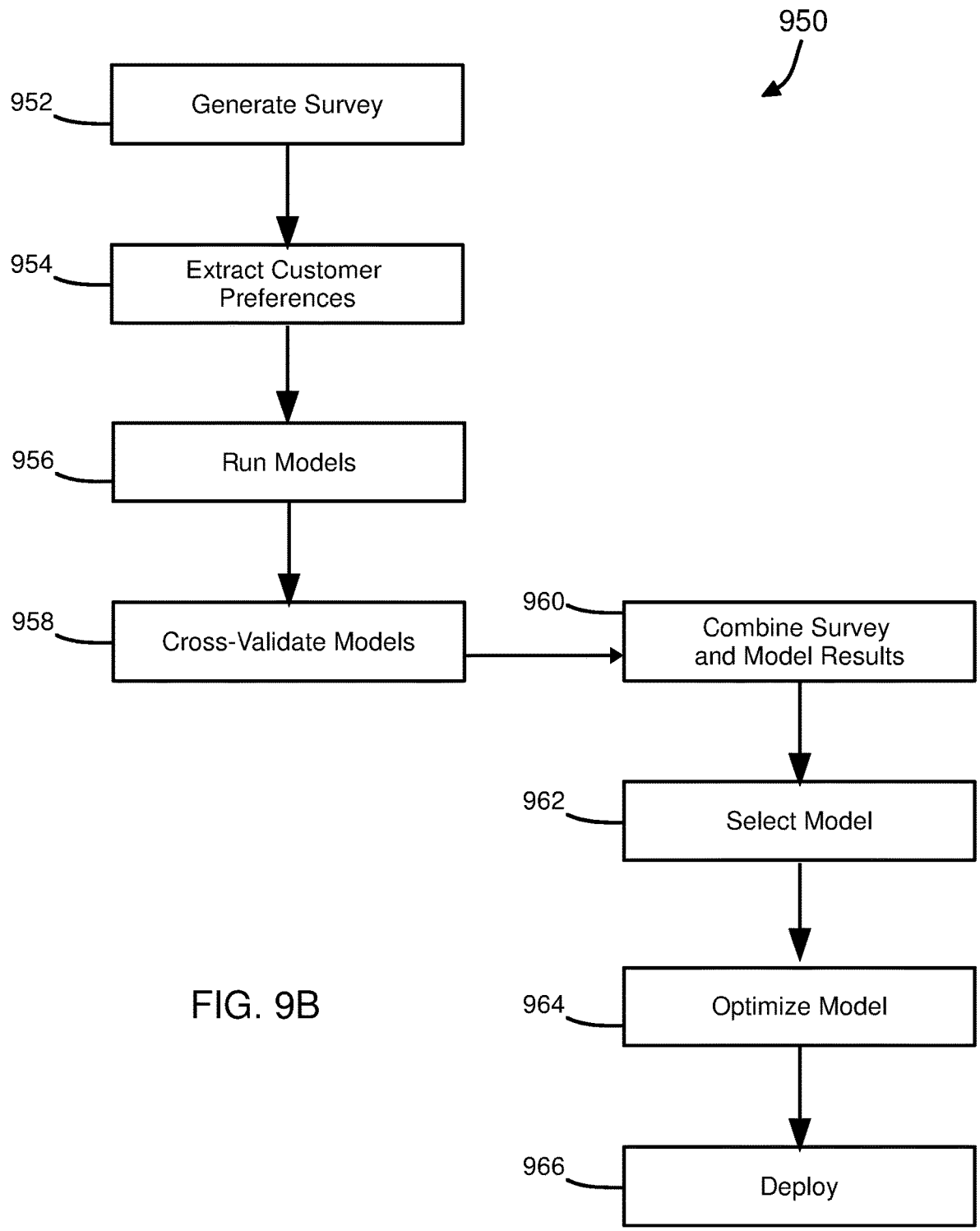
FIG. 9B is a flow chart illustrating an alternative process for selecting a predictive model.

One method 950 for automatic selection of the final predictive model is illustrated in FIG. 9B, in which a machine-implemented method obtains initial parameter limits from the customer input. In step 952, a user survey is generated through the GUI to guide the customer through various linear and/or non-linear parameter trade-offs between different objectives for the customer. The approach to configuring for trade-off analysis could be based one or more different methods. For example, utility theory is based in the economic premise that people consistently rank order their choices based on their individual preference for the options presented, and an additive utility function can be configured for the survey to assess the customer preferences from the responses. Similarly, multi-attribute utility theory presents attributes associated with the choices, and a multiplicative function can likewise be configured for the survey to assess the customer preferences. Another method is based in preference theory, where economic constraints affect customer preference, and fuzzy math functions are configured to assess preferences. Other methods can of course be employed.

In step 954, the customer preferences are extracted from the survey responses. In a wafer sort example, the responses may indicate that the customer has a preference for accepting a first threshold number of defects without taking further action; but greater than the first threshold number of defects requires at least a first level investigation into cause(s); and greater than a second threshold number of defects require more urgent investigation and corrective action. In an example for process equipment, sensors, etc., the responses may indicate that the customer prefers to inspect when the data indicates there is a 30% chance of a non-catastrophic failure; or to take immediate corrective action when there is a 50% chance of catastrophic failure; or other such limitations. In particular, the economic value of setting a threshold higher or lower for a particular parameter is usually the driving force for the customer defined limits, and the ability for the customer to evaluate different scenarios is important for their decision-making. In terms of the predictive models, this set of criteria can define how to tune and select the ML model. If the cutoff indicates a 30% chance of non-catastrophic failures, the model could be improved by focusing on this section of ROC curve. Like the "waterbed effect" in control theory, there is a similar effect for a predictive model where if you try to boost performance for a particular part of the ROC curve, it may reduce performance for another part of the ROC curve.

The static or dynamic survey can be configured to provide adequate and relevant data, including economic impact of factors such as product losses, testing, and equipment downtime, as context to allow the customer to set appropriate limits for relevant parameters in their specific application. Different customers will of course have different objectives and parameters of interest that drive their setting of limits for parameter criteria, whether related to fabrication steps or post-fabrication steps.

Importantly, as discussed above, machine learning models can be configured to analyze complex data relationships involving significant amounts of data. This enables the selection of features that are most relevant to the particular problem or parameter of interest to thereby create a model specifically tailored to and based upon the customer preferences and limitations as determined through the survey. Most of the survey approaches present parameter trade-offs by either (i) identifying the point at which the utility between two choice points is considered identical from the customer perspective, e.g., both choices present a similar economic impact; or (ii) comparing two alterative choices. By obtaining answers to these questions, the trade-off curve can be created. For example, for a number of different configurations, select whether option A is better or worse than option B. This type of binary functionality can be readily built into the model to capture user utility/preferences.

Thus, user guidance may be provided in terms of a standard utility function and a standard preference function, developed through a machine learning model, but the user can also define and develop non-standard utility and/or preference functions.

In step 956, a number of different models are run, each configured with a different algorithm for predicting the target feature, but using the extracted customer preferences. Further, in step 958, each model is run through several different random cross-validations to capture and evaluate possible ROC distribution curves.

In step 960, the survey results are combined with the model results to determine and select the model in step 962 that best satisfies both goals, accurate prediction and customer preference. Thus, the optimal model and relevant effective thresholds are selected based on the consideration of trade-offs from the customer survey. The results of different combinations of limits and thresholds for different parameters can be presented graphically or as data tables in the GUI in order to illustrate for the customer the impact of changes in selection criteria. For example, if returning a false positive for chip has an economic impact that is 100 times more costly than returning a true positive, then model A 1001 on FIG. 10 should be selected and thresholds set that produce 40% true positive and less than 0.5% false positives. However, if returning a true positive is considered 100 times more important than returning a false positive for any rationale, the model B 1002 on FIG. 10 should be selected and thresholds set that produce 30% false positive and greater than 99.5% true positives.

Finally, in step 964, the selected model can be optimized further, for example, through feature engineering and selection, and the final model deployed in step 966 for production analysis of its target feature(s).

Thus, the decision-making tool can help the customer evaluate data for important use cases and set rational, useful limits for key parameters that have a positive impact on a feature of interest. As one example, the decision-making tool can be used to help reduce Returned Merchant Authorizations (RMAs), also known as field returns. The cost of RMAs may not be linear and also may not be easily quantifiable and therefore RMAs are a good candidate for a machine learning modeled analysis.

As is typical, the customer may indicate a preference to keep the defect rate (e.g., defect parts per million (DPPM)) low, e.g., defects<10 DPPM. However, experience indicates that even a single digit difference in DPPM could represent a significant cost impact; for example, the negative cost impact of the difference between 9 DPPM and 10 DPPM is much more than the difference between 8 DPPM vs 9 DPPM. Thus, a key question for the customer is how much yield loss is acceptable? Further, would additional visual inspection, triggered by the predictive model, detect equipment issues earlier, such as a few hours, a few days, or few weeks earlier?

Figure 15:
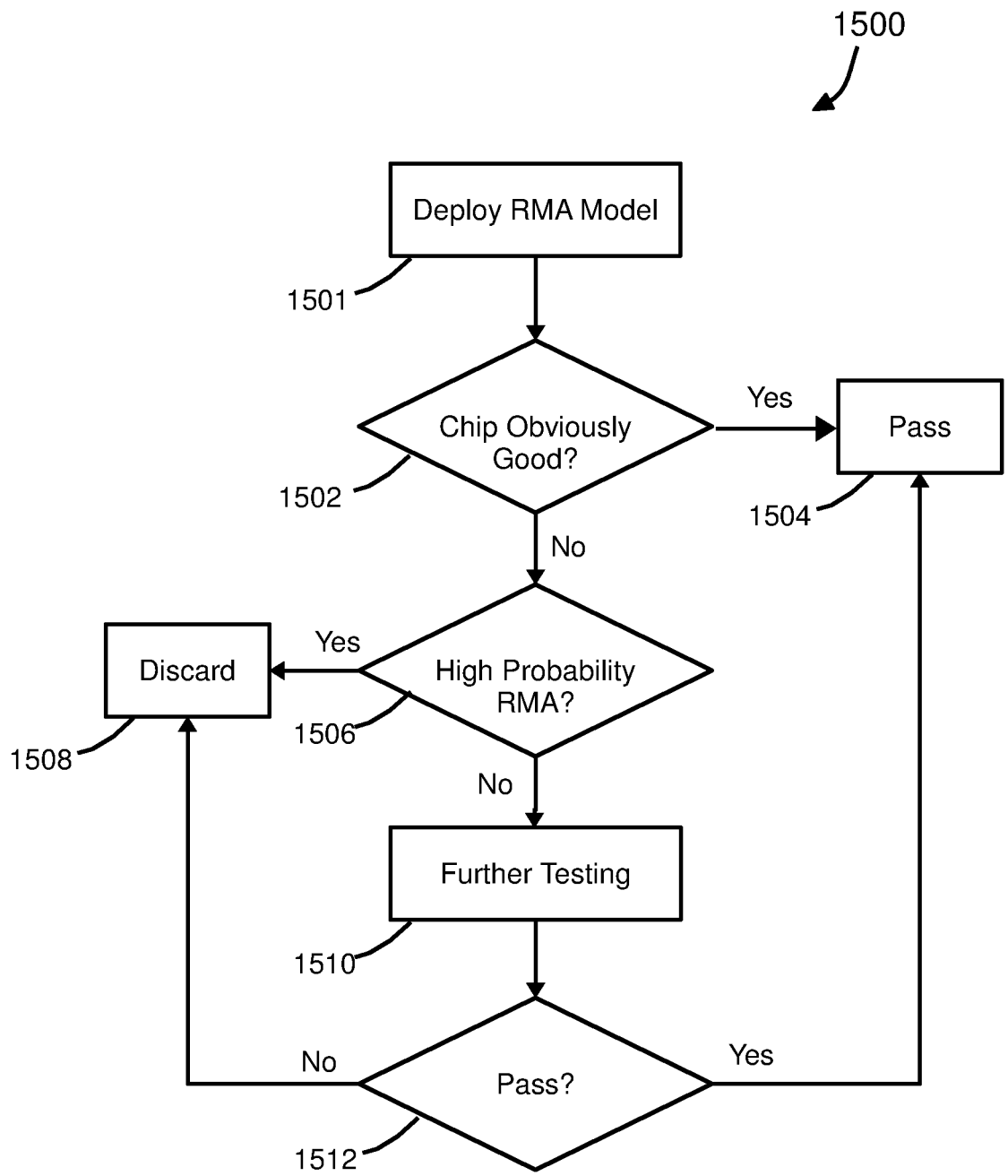
FIG. 15 is a flow chart illustrating a first example application for the predictive model of FIG. 9A.

FIG. 15 illustrates a simple process 1500 for using the decision-making tool to evaluate RMAs. As described with regard to FIGS. 9A and 9B, a model is configured with customer parameters and limits and deployed into production at step 1501. In step 1502, if the model indicates that the chip is obviously good based on the customer preferences, then the chip is passed in step 1504 without further testing. If the chip is not obviously acceptable in step 1502, then the next question in step 1506 is whether the chip has a high probability of being an RMA. If the model indicates in step 1506 that yes, the probability exceeds the customer threshold for RMAs, then in step 1508 the chips are discarded. However, if the probability does not exceed the customer threshold in step 1506, then further testing is performed on the chips in step 1510. If the chips fail testing in step 1510, they are discarded in step 1508; but if they pass further testing in step 1510, the chips are passed to step 1506.

The customer of course faces difficult decisions in evaluating trade-offs, such as the incremental increase or decrease in RMAs as a result of skipping initial testing in step 1502, or performing further testing in step 1510, or discarding chips in step 1508, for example. In addition, the associated economic impact with each of these decision points can be difficult to quantify. A number of model iterations may be tried before the customer is satisfied with their how their preferences play out into rational parameter settings and limits.

Preventative maintenance is another example where the decision-making tool can be beneficial. In particular, the cost of downtime due to catastrophic equipment failure can be significant and must be avoided. Downtime due to non-catastrophic equipment maintenance efforts can be managed more effectively to mitigate the negative impacts of any necessary downtime.

Figure 16:
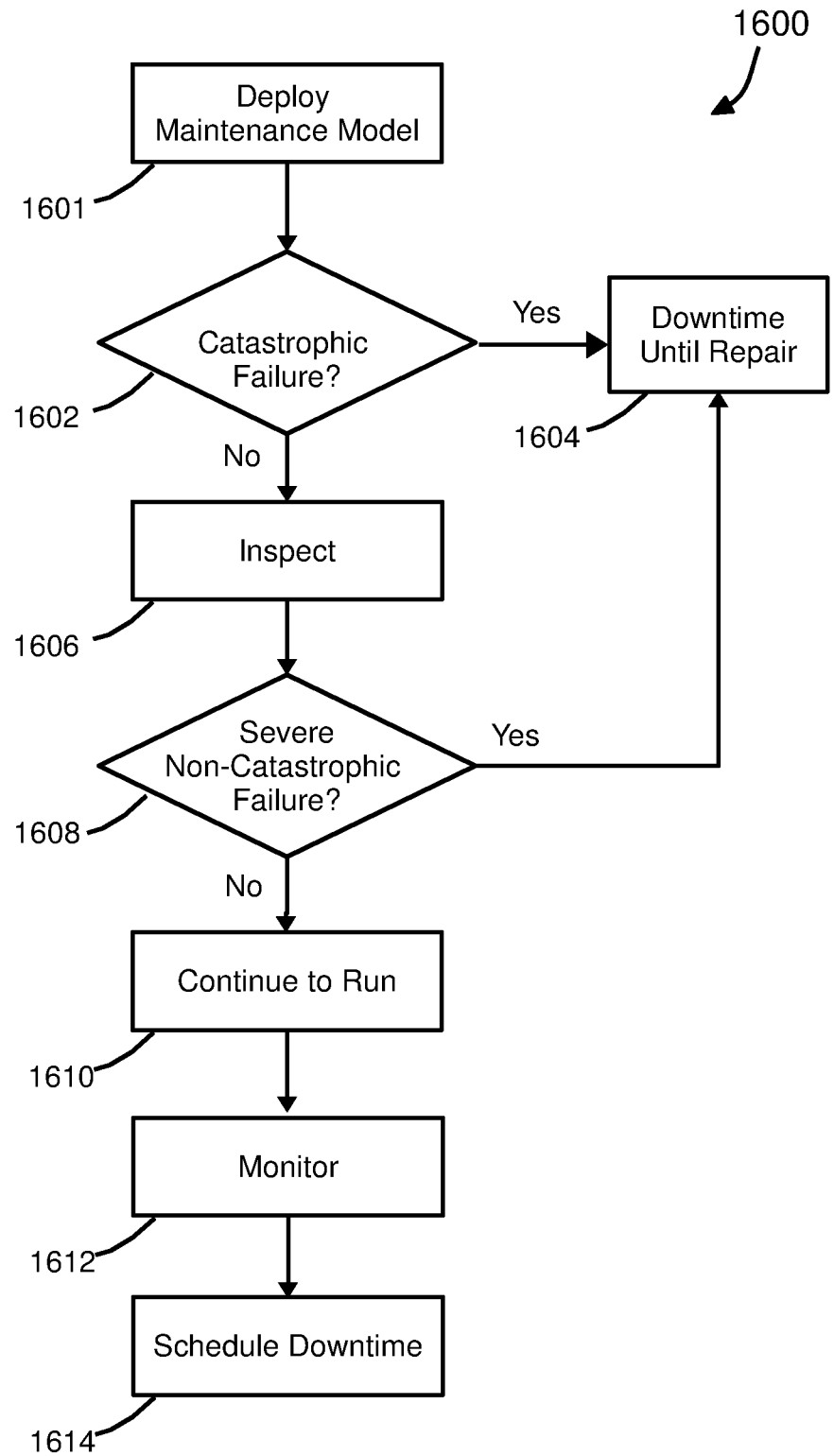
FIG. 16 is a flow chart illustrating a second example application for the predictive model of FIG. 9A.

For example, FIG. 16 illustrates a process 1600 for using the decision-making tool to evaluate equipment issues. After building a model with customer preferences and limits and deploying the same into production at step 1601, an equipment failure issue arises and the first question in step 1602 is whether the failure is catastrophic. If so, then in step 1604 an immediate process shutdown is called for and the problem corrected. If the equipment failure is not catastrophic, then an inspection of the equipment is undertaken in step 1606. If upon inspection the problem is determined to be severe in step 1608, then an immediate shutdown is called for in step 1604.

If upon inspection in step 1608, the problem is determined to not be severe, then in step 1610 the process continues to run, but in step 1612, the customer closely monitors the problem, as well as scheduling downtime in step 1614 to repair or replace the equipment to resolve the issue.

A number of issues are involved with the customer trade-offs for preventative maintenance. As noted, sudden catastrophic failures are hard to measure in terms of cost and impact on other processing steps, but over time, the selected model(s) can provide such guidance. The cost and impact of equipment degradation before failure can be significant as well. The cost of running with non-catastrophic failures may result in some good chips being classified as bad and vice versa. For example, the quality of an image from a sensor may degrade over time as the lens yellows resulting in more chips not meeting critical dimension criteria. Thus, failure modes can be modeled to evaluate cost trade-offs related to the cost of catastrophic failures, equipment degradation, scheduled maintenance, inspections, etc.

While the preceding discussion has focused on binary decisions for evaluating acceptable parameter trade-offs, the concepts described could also be implemented and extended for other types of multi-class classification, linear and non-linear regression, anomaly detection and/or other model problems. As one example, multi-class classifiers are generally known and could be implemented to provide an even more informed and balanced approach to decision making than a simple binary choice.

In one application, evaluating equipment maintenance issues often require at least several different levels of attention. While a first consideration may be binary: is the issue catastrophic failure or not; beyond the first consideration, multiple levels of evaluation may be appropriate. For example, early detection/prediction of catastrophic failure is obviously important for any manufacturing operation. Implementing a multiclass system presents a more nuanced approach by considering a spectrum having numerous points (or outcomes) of possible equipment maintenance concerns, including some or all of the following categories: routine inspection; routine scheduled maintenance; routine scheduled replacement; non-routine inspection/maintenance/replacement; unexpected failure. And of course, each class or category has different values and/or customer preferences or utility values representing different equipment types.

Further, it may be possible to drill down into details of specific equipment issues to evaluate impact on production and cost. As an example, a simple categorization of electrical malfunctions could include a short circuit, an open circuit, or an intermittent failure. Presenting the customer with these categories along with their impact on yield and cost allows the customer to identify preferences, limits, utility functions, and other relevant parameter thresholds for implementing the customer decision-making tool.

Accordingly, the customer survey can be modified to expand beyond considering merely binary trade-offs to considering any number of different categories or levels of detail in any aspect of fabrication and post-fabrication processing. While extracting customer preferences can be more complex for multiclass models, machine learning is well-suited for this type of application in order to evaluate multi-variate relationships among input data. In combination with feature engineering and featuring selection techniques, the models developed can provide accurate and reliable predictive tools customized to meet the utility and/or preferences provided by the customer.

Regression techniques can also be effective for defining the relationships between dependent variables and independent variables when modeling a target feature. As an example, predicting yield for low-yielding wafers may be identified by the customer as more critical than predicting yield for high-yielding wafers, since correction of the issue causing the low yield has a more significant impact on overall yield and cost. Further, since this issue is usually a function of equipment failure or wear, a model to predict remaining useful life (RUL) for processing equipment can be very useful for the customer and effectively modeled using regression techniques. The customer survey is modified to allow the customer to identify critical limits for associated parameters in order to make RUL predictions for particular equipment.

Thus, for a number of different parameters, the customer is basically answering the question: what error is tolerable? Linear regression techniques can, for example, provide an illustration of the "best fit" line among a data set, and the customer can set critical and non-critical limits accordingly. One example would be a model to predict yield based on lithography results, allowing the customer to set critical and non-critical tolerance limits in the x- and y-directions. Nonlinear regression models such as tree-based models or Neural Network based models can provide illustration of more complex data inter-relationships, and can provide real value targets rather than categorical targets. For example, yield can be predicted as a percentage from 0-100, or remaining useful life can be predicted in days, weeks or months.

Detection of anomalies can usually be handled through classification techniques, e.g., by setting customer preferences as to what bins to assign to particular defects. Once again, the ultimate question for the customer is going to be deciding what is more tolerable, and at what level: throwing away some good chips when the model says the defects in this lot are critical, or keeping some bad chips when the model says most of the chips are fine?

Predictive models can be implemented in a number of different ways to focus on different customer issues in fabrication or post-fabrication processing, with binary functions, multiclass functions, statistical functions, etc. Likewise, surveys can be constructed and presented to guide the customer through trade-offs or other classification schemes in order to establish the customer's utility and/or preference associated with a particular result for the parameter or target feature of interest. Once the customer preferences and/or utility are established, multiple predictive models are run, and selection of the final model is based on the customer's utility and/or preferences.

6. RMA Predictions

This disclosure describes a system for predicting Returned Merchant Authorizations (RMAs) for packaged electronic chips. The prediction of RMAs can be achieved by combining sources of semiconductor test data collected throughout the chip manufacturing process. Examples of such data can include electrical, thermal and mechanical test data at the wafer and chip levels.

The manufacturing process for electronic chip can begin in the foundry at the wafer level which are themselves organized in lots. The wafer can be subjected to various tests and data are collected as the wafer moves through the schedule of processing steps. The data collected at the wafer level can be termed WAT (Wafer acceptance test) or PCM (Process Control Monitoring) data. The processed wafer with chips delivered from the foundry to the chip manufacturer can then be subjected to a different set of tests typically called as WS (wafer sort) or CP (chip probe) tests. The wafer can then be diced into individual chips and chips that are deemed good based on the WS data are then packaged and subjected to the final package-level tests. The data collected during this final stage can be called FT (final test) data. The chips deemed good based on the FT data can be shipped to the chip users (typically device or system manufacturers).

The device/system manufacturers can run separate system-level tests (SLTs), which are can be unknown to the chip manufacturer. The chips that fail based on the SLTs can be returned back to the chip manufacturer. Alternatively, the chips can fail in the field after they finish all testing (including SLT). The term typically used to identify these failed parts is "RMA", which stands for Return Merchandise Authorization. Included in this document is a description of a system to use PCM/WAT, WS/CP and FT data to identify chips likely to be returned (RMA'ed) as a result of failing the SLTs.

The system can find use in (but is not limited to) predicting or flagging defective chips in automotive, telecom, consumer, server-side, and high-performance computing sectors.

Input Transformation and Data Enrichment

PCM/WAT Data Enrichment

Figure 11:
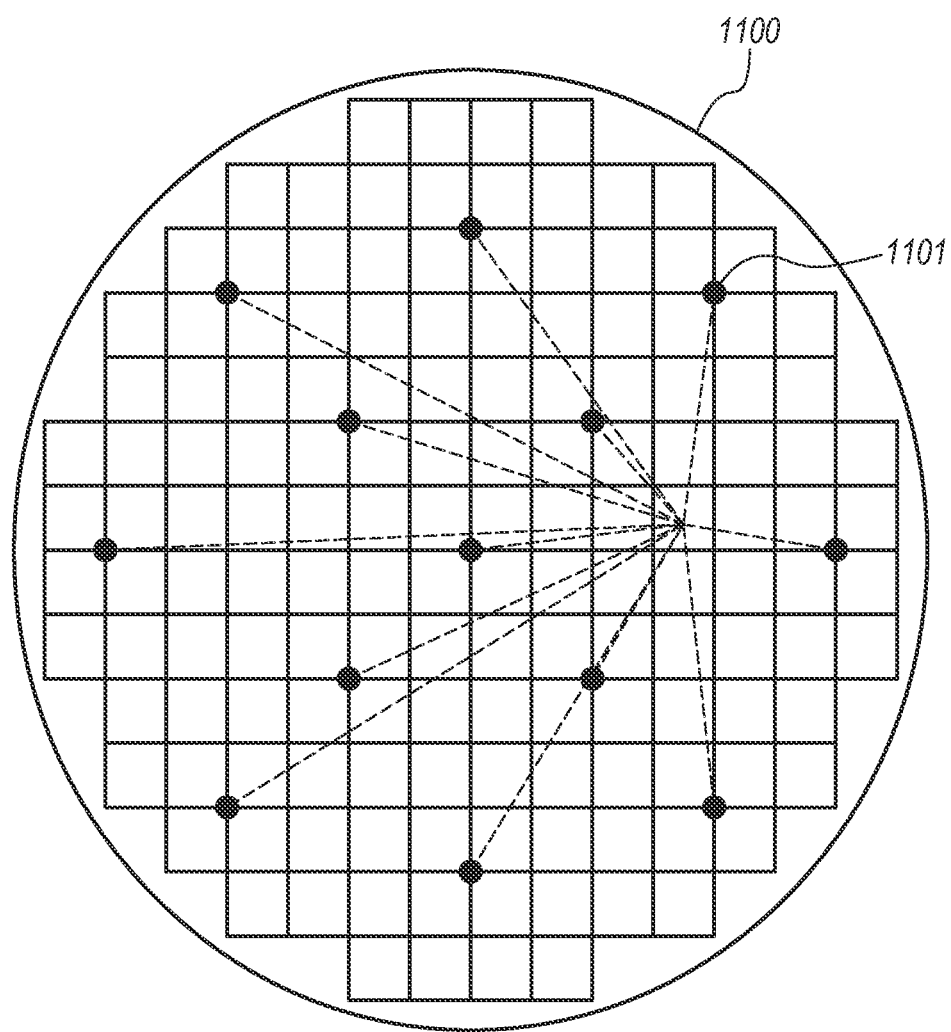
FIG. 11 is a schematic diagram of wafer measurement sites on a wafer in production.

PCM data can be collected at predefined wafer sites for wafer 1100 (typical examples are 9 or 13 sites per wafer) as illustrated in FIG. 11. These wafers sites are not necessarily aligned with chip locations and are typically less than the number of chips on the wafer. Enrichment of the PCM data therefore may require mapping the site data to chips. One way to perform this mapping is by taking the inverse distance weighted average of the PCM site data and assigning to each chip. The contribution of the each PCM site to a chip can be inversely proportional to its distance to the chip under consideration, as shown in Equation 1.

Mathematically, for each chip n, the features of the PCM data can be computed as:

$$X_{chip\ n} = \frac{1}{M}\sum_{i=1}^{M}\frac{X_{site\ i}}{dist(\text{chip } n, \text{ site } i)} \quad \text{(EQ. 1)}$$

where M is the number of PCM measurement sites and X_sitei is the PCM measurement vector for site number i. Since the XY coordinates of the chip and the measurement site are known in advance, the (Euclidean) distance can be computed simply as:

$$\text{dist}(\text{chip } n, \text{site } i) = [(x_n - x_i)^2 + (y_n - y_i)^2]^{1/2} \quad \text{(EQ.2)}$$

WS Data Enrichment

The WS data can contain hundreds or thousands of measurement fields (a typical example is 250 measurement fields) which can be persistent week-over-week. In addition to the electrical measurements, we can enrich the WS data in the following ways.

Chip Count Per Wafer at WS

The number of chips for which the data was recorded at the WS level can be an indicator of the wafer quality. If data for only a few chips from a given wafer were tested at WS, it can mean that most of the chips from this wafer failed before WS testing and can be an indication of poor wafer quality. On the other hand, if most or all chips from a wafer were tested at WS, it can be an indication of a potentially high wafer quality.

Fraction of Passing Chips Per Wafer at WS

Hardbin represents categorization of the health of chip. Usually, assignment of hardbin=1 at WS can indicate that a chip passed testing at WS. The fraction of the chips passed at WS can be an indicator of high wafer quality. If majority are hardbin>1 at WS, it can indicate poor wafer quality.

Fraction of Each Hardbin Label Per Wafer at WS

At WS chips can be binned into numeric bins ranging from WS hardbin=1 to WS hardbin=n. Hardbin is a code typically applied to a particular test result. For example, hardbin=1 typically means that the chip passed the test, while hardbin>1 typically means that the chip failed that test, for reasons which are indicated by the particular hardbin code. Alternatively, softbin code can be used to describe the test output, similar to hardbin but typically more descriptive of the root cause of the failure. We can count the fraction of each hardbin label grouped by wafer, and assign that fraction as a feature to each chip on the wafer.

Lot Level Aggregation at WS

All the above WS features can also aggregated at the lot level and the lot-level averages are assigned as features to individual chips.

FT Data Enrichment

The FT data can contain up to hundreds or thousands of measurements (a typical example is about 50 measurement fields) which are persistent week-over-week. In addition to the electrical measurements, we can enrich the FT data in the following ways.

FT Failure Propensity for Each Chip, Computed from PCM+WS Data

At final test, chips can be assigned a FT hardbin. Hardbin=1 can indicate a pass at FT and Hardbin>1 can indicate a FT fail. It is possible that a chip passes targeted FT tests (FT hardbin=1) but is in fact a bad chip. There are signals in the WS data indicating the health of this chip. So we can use a FT failure propensity, computed from the WS data, as one of the features of our model. This computation can be performed by an intermediate supervised learning step which is trained on WS data as features and FT pass/fail as the label. The probability of the FT failure can be used as the feature.

Wafer-Level Mean and Standard Deviation of FT Failure Propensity

In addition to computing the FT failure propensity for each chip, we can also compute the wafer level mean and standard deviation of the propensity values. This can provide an idea of the wafer quality, as viewed by the entirety of the WS and PCM data. A high mean propensity value can indicate that a majority of chips on this wafer have a high failure propensity value and can indicate a poor wafer health. A low mean failure propensity can indicate that most chips on the given wafer have a low failure propensity and can indicate a good wafer health. A high standard deviation of propensity value can indicate a large variance in the chip quality across the wafer and signifies a potentially problematic wafer.

Chip Count Per Wafer at FT

The number of chips that passed at the WS level can be an indicator of the wafer quality. If data for only a few chips passed from WS, it can be an indication of poor wafer quality. On the other hand, if most or all chips passed at WS, it can be an indication of a healthy wafer.

Fraction of Passing Chips Per Wafer at FT

Just as with WS, an assignment of hardbin=1 can indicate a pass at FT and assignment of hardbin>1 can indicate a FT fail. The fraction of the chips passed at FT can be an indicator of good wafer health.

Fraction of Each Hardbin Label Per Wafer at FT

At FT chips can be binned into numeric bins ranging from FT hardbin=1 to FT hardbin=n. We can count the fraction of each hardbin label grouped by wafer, and typically assign that fraction as a feature to each chip on the wafer.

Lot Level at Aggregation at FT

All the above FT features can also be aggregated at the lot level and the lot-level averages can be assigned as features to individual chips.

Additional Features and Data Enrichment

Radial Zone

We can divide the wafers into N radial zones of equal area. Typically N ranges between 5 to 7. Dividing into zones captures the radial dependence in chip characteristics often found in the manufacturing process.

Dimensionality Reduction

The dataset can be prepared for modeling by assigning to each chip the raw measurement fields from PCM, WS and FT as well as augmenting the raw fields with the engineered/enriched features as described above. This can be about 1500-2000 features (or predictor variables) per chip. A large number of features can degrade the performance of some modeling techniques. Particularly, techniques that rely on nearest neighbor approaches are especially prone to this problem. This issue is mitigated by performing dimensionality reduction. We can use linear as well as non-linear dimensionality reduction on the full dataset. Approaches can include:

1. Principal component analysis
2. t-distributed stochastic neighbor embedding (tSNE)
3. Locally linear embedding
4. Isomap
5. Auto Encoder
6. Restricted Boltzmann Machines Oversampling The dataset can exhibit significant skew. That is the ratio of positive (RMA) to negative examples (non RMAs) is small. For ~400 defective parts per million (DPPM), the ratio is ~0.0004. Machine learning models built on skewed datasets can exhibit a bias toward the majority class. One way to reduce this bias is to oversample the minority class. Oversampling methods can be the following:

1. Random oversampling
2. Synthetic minority oversampling technique (SMOTE)
3. Bagging Classification of RMA Error Codes An RMA can be viewed as a failure of an independent SLT. Modern chips or system on chips can have multiple subsystems including CPU, GPU, Codecs, Memory, cache, management, communication, and IO control. An SLT failure can result due to bad operation of any of the above subsystems. Some of the failures can be captured from PCM, WS and FT data. Others can be more difficult to map to the defects in manufacturing process. It therefore can be necessary to classify the RMA'ed chips into failure codes indicating the subsystem that failed. This classification should be accurate and consistent. Accuracy can refer to proper tracing of the SLT failure to the appropriate subsystem. Consistency can refer to the stability (or, alternatively, noise) of the mapping between a subsystem and the failure code. Ideally, the RMA classification will map an SLT failure to the appropriate subsystem and assign a consistent code.

Model Architectures

Single-Level Model

Figure 12:
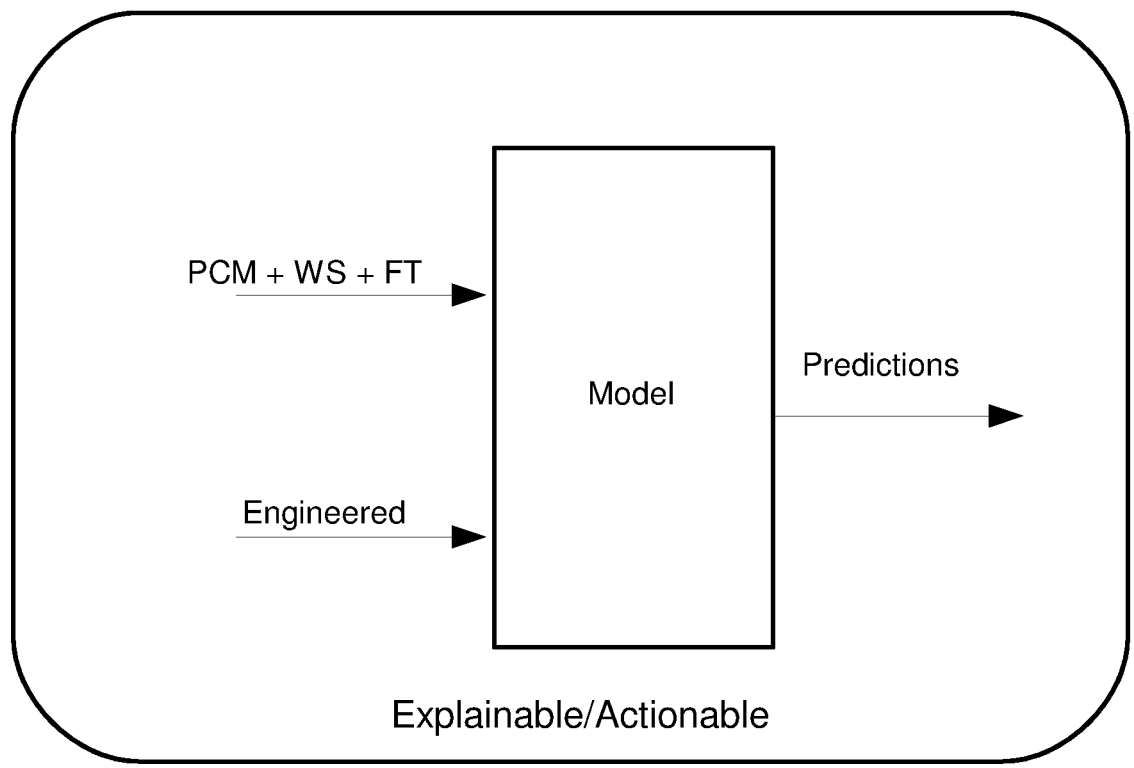
FIG. 12 is a block diagram depicting a single-level model architecture.

One possible single-level model architecture, depicted in FIG. 12, inputs the raw and engineered features into a machine learning model and outputs RMA probability. The machine learning algorithms used for this step can be parametric or nonparametric. Logistic regression, support vector machines and neural networks are examples of parametric models that can be used. Decision trees, Random forests, Gradient Boosted Machines and nearest neighbor classifiers are examples of non-parametric models that can be used.

A key feature of single-level architecture can be interpretability; single level architectures can provide a direct mapping of computed feature importance to key test variables. This can aid in identification of process parameters that need further tuning to enhance the yields.

Multi-Level Architecture

Figure 13:
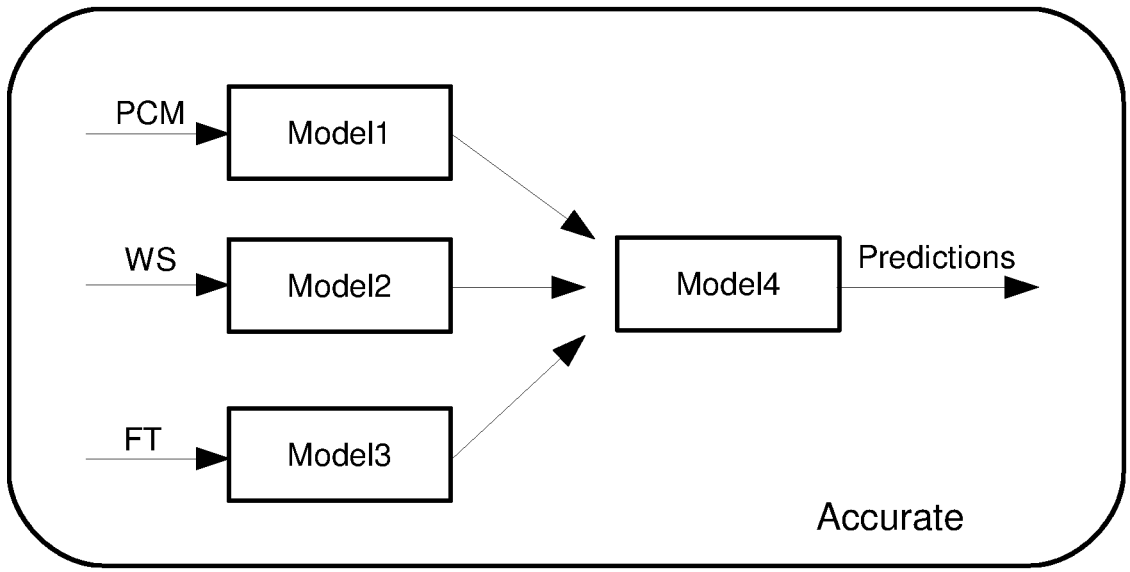
FIG. 13 is a block diagram depicting one embodiment of a two-level model architecture.

One possible two-level model architecture, depicted in FIG. 13, creates separate level-1 models for each data source. The predictions from these models can then fed as features to a level-2 model to obtain final predictions.

Figure 14:
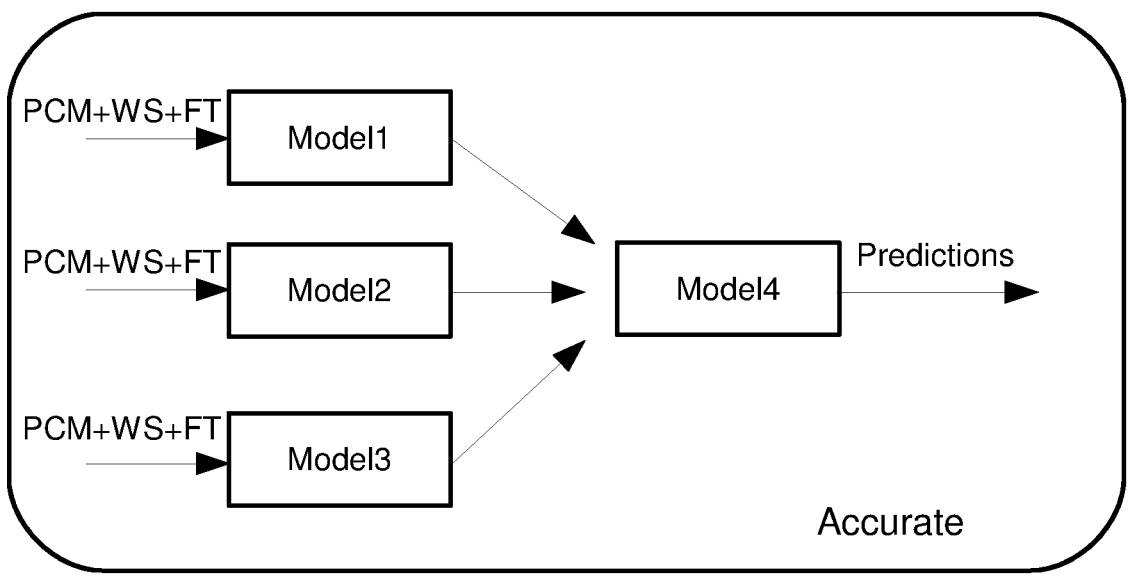
FIG. 14 is a block diagram depicting another embodiment of a two-level model architecture.

Second possible two-level model architecture, depicted in FIG. 14, creates three separate level-1 models, using all data sources (engineered+raw features), and can feed the RMA propensities to a level-2 model. The output of level-2 model can be the final prediction.

The main insight behind the multi-level models can be that different algorithms capture different possible error modes. In other words, different models can be sensitive to different patterns in the signals. So combining separate models sensitive to different parts of the signal can likely boost the overall accuracy.

A main drawback of multi-level model can be the loss of direct mapping between variable importances and test fields.

Anomaly Detection

Anomaly detection is a popular technique for dealing with highly imbalanced datasets. Anomaly detection can be used both as an unsupervised scoring technique, as well as an engineered feature.

When used as an unsupervised scoring technique, anomaly detection can help the chip manufacturer to create bins of chips based on the anomaly score. The bins with high anomaly score can have a higher proportion of defective chips. These bins can then be marked for further testing to weed out bad chips prior to shipping.

When used as a feature engineering technique, anomaly detection can be used as a level-1 or a level-2 model in the multi-level model architecture.

The foregoing written description is intended to enable one of ordinary skill to make and use the techniques described herein, but those of ordinary skill will understand that the description is not limiting and will also appreciate the existence of variations, combinations, and equivalents of the specific embodiments, methods, and examples described herein.

The invention claimed is:

1. A method for generating a robust predictive model for a target feature in a semiconductor process, comprising:
identifying a plurality of minimum performance criteria for the target feature;
generating a plurality of different predictive models each configured to predict the target feature;
for each of the plurality of predictive models that meet the plurality of minimum performance criteria for the target feature, comparing a plurality of true positive results for the target feature with a plurality of false positive results for the target feature;
based on defined selection criteria for the comparison of true positive results with false positive results, selecting one of the plurality of predictive models that meet the plurality of minimum performance criteria; and
deploying the selected predictive model into the semiconductor process.

2. The method of claim 1, the selecting step further comprising:
displaying the true positive results and the false positive results to a user in a user interface; and
manually selecting, by the user, one of the plurality of predictive models based on a preference for a lower number of false positive results with a user-specified constraint on the true positive results.

3. The method of claim 1, the selecting step further comprising:
displaying the true positive results and the false positive results to a user in a user interface; and
manually selecting, by the user, one of the plurality of predictive models based on a preference for a higher number of true positive results with a user-specified constraint on the false positive results.

4. The method of claim 1, the selecting step further comprising:
automatically selecting one of the plurality of predictive models and setting a plurality of respective thresholds for a plurality of key parameters for the selected model based on user utility and/or preferences, the key parameters associated with the target feature.

5. The method of claim 4, further comprising:
displaying the true positive results and the false positive results to a user in a user interface;
receiving user input from the user through the user interface to establish the user utility and/or preferences for the plurality of key parameters; and
automatically selecting one of the plurality of predictive models based on the user input.

6. The method of claim 5, further comprising:
generating and displaying a survey to the user for guiding the user through a plurality of trade-offs associated with the plurality of key parameters of the target feature; and
receiving and storing responses to the survey from the user;
extracting user utility and/or preferences for the plurality of trade-offs associated with key parameter from the user responses; and
selecting one of the plurality of predictive models based on the customer utility and/or preferences.

7. The method of claim 6, the generating step further comprising:
configuring a mathematical function to evaluate and present for display the plurality of trade-offs based on the user utility and/or preferences.

8. The method of claim 6, the generating step further comprising:

configuring a plurality of different mathematical function to separately evaluate and present for display the plurality of trade-offs based on the user utility and/or preferences.

9. The method of claim 8, further comprising:
configuring at least a utility function and a preference function to separately evaluate and present for display the plurality of trade-offs.

10. A method for generating a robust predictive model for a target feature in a semiconductor process, comprising:
identifying a plurality of minimum performance criteria for the target feature;
generating a plurality of different predictive models each configured to predict the target feature;
performing a comparative analysis of results from each of the plurality of predictive models that meet the plurality of minimum performance criteria for the target feature;
displaying the comparative analysis of results in a user interface;
receiving user input from the user interface to establish customer preferences and/or customer utility for each of a plurality of key parameters associated with the target feature;
selecting one of the plurality of predictive models that meet the plurality of minimum performance criteria based on the customer preferences and/or customer utility for each of the plurality of key parameters; and
deploying the selected predictive model into the semiconductor process.

11. The method of claim 10, further comprising:
performing the comparative analysis using a binary function.

12. The method of claim 11, further comprising:
displaying results of the binary function in the user interface as trade-offs for each of the plurality of key parameters.

13. The method of claim 11, the selection step further comprising:
selecting one of the plurality of predictive models based on a customer preference for a lower number of false positive results with a user-specified constraint on true positive results.

14. The method of claim 11, the selection step further comprising:
selecting one of the plurality of predictive models based on a customer preference for a higher number of true positive results with a user-specified constraint on false positive results.

15. The method of claim 10, further comprising:
performing the comparative analysis using a multiclass function.

16. The method of claim 15, further comprising:
displaying results of the multiclass function in the user interface as a plurality of categories for each of the key parameters; and
selecting one of the plurality of predictive models based on customer preferences within each category.

17. The method of claim 10, further comprising:
performing the comparative analysis using a statistical function.

18. The method of claim 10, further comprising:
performing the comparative analysis using a regression function.

19. The method of claim 10, the selecting step further comprising:

manually selecting one of the plurality of predictive models based on the customer preferences and/or customer utility for each of the plurality of key parameters.

20. The method of claim 10, the selecting step further comprising:
automatically selecting one of the plurality of predictive models based on the customer preferences and/or customer utility for each of the plurality of key parameters.

21. The method of claim 10, the step of receiving user input further comprising:
generating and displaying a survey in the user interface for guiding a user through a series of questions designed to obtain customer preferences and/or customer utility associated with the plurality of key parameters of the target feature;
receiving and storing responses to the survey from the user;
extracting customer preferences and/or customer utility for each of the key parameters from the user responses; and
selecting one of the plurality of predictive models based on the customer preferences and/or customer utility.

22. A robust predictive model for predicting a target feature in a semiconductor process including a processor and non-transitory storage for program instruction, the program instructions configured for causing the processor to:
identify a plurality of minimum performance criteria for the target feature;
generate a plurality of different predictive models each configured to predict the target feature;
perform a comparative analysis of results from each of the plurality of predictive models that meet the plurality of minimum performance criteria for the target feature;
display the comparative analysis of results in a user interface;
receive user input through the user interface to establish customer preferences and/or customer utility for each of a plurality of key parameters associated with the target feature; and
select one of the plurality of predictive models that meet the plurality of minimum performance criteria based on the customer preferences and/or customer utility for each of the plurality of key parameters.

23. The robust predictive model of claim 22, the program instructions further configured for causing the processor to:
generate and display a survey in the user interface for guiding a user through a a series of questions designed to obtain customer preferences and/or customer utility associated with the plurality of key parameters of the target feature;
receive and store responses to the survey from the user; and
extract customer preferences and/or customer utility for each of the key parameters from the user responses.

24. The robust predictive model of claim 22, the program instructions further configured for causing the processor to:
perform the comparative analysis using a binary function; and
display results of the binary function in the user interface as trade-offs for each of the plurality of key parameters.

25. The robust predictive model of claim 22, the program instructions further configured for causing the processor to:
perform the comparative analysis using a multiclass function.

26. The robust predictive model of claim 22, the program instructions further configured for causing the processor to:

perform the comparative analysis using a statistical function.

27. The robust predictive model of claim 22, the program instructions further configured for causing the processor to:
   perform the comparative analysis using a regression function.

* * * * *